(12) United States Patent
Onimaru et al.

(10) Patent No.: US 9,335,350 B2
(45) Date of Patent: May 10, 2016

(54) ELECTRONIC DEVICE AND CURRENT MONITORING METHOD

(71) Applicant: FUJITSU LIMITED, Kawasaki-shi, Kanagawa (JP)

(72) Inventors: Hiroshi Onimaru, Fukuoka (JP); Yuji Ishii, Fukuoka (JP); Kenji Rikimaru, Fukuoka (JP); Kenichi Kawazoe, Kurume (JP); Hiroshi Adachi, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 155 days.

(21) Appl. No.: 14/304,161

(22) Filed: Jun. 13, 2014

(65) Prior Publication Data

US 2015/0022225 A1 Jan. 22, 2015

(30) Foreign Application Priority Data

Jul. 16, 2013 (JP) .................................. 2013-147438

(51) Int. Cl.
*G01R 27/08* (2006.01)
*G01R 19/00* (2006.01)
*G01R 1/20* (2006.01)

(52) U.S. Cl.
CPC ............ *G01R 19/0092* (2013.01); *G01R 1/203* (2013.01)

(58) Field of Classification Search
CPC ............. G01R 19/0092; G01R 31/343; G01N 33/1886; H01L 29/7393
USPC ............ 324/600, 713, 500–521, 522, 764.01, 324/718; 320/109–126, 160; 702/60–65, 702/297, 298
See application file for complete search history.

(56) References Cited

U.S. PATENT DOCUMENTS 8,803,546 B2 * 8/2014 Deng ........................ 324/764.01
2003/0016027 A1 * 1/2003 McMahon et al. ............ 324/600

FOREIGN PATENT DOCUMENTS

JP 06-138174 5/1994
JP 2007-280643 10/2007

* cited by examiner

*Primary Examiner* — Melissa Koval
*Assistant Examiner* — Trung Nguyen
(74) *Attorney, Agent, or Firm* — Staas & Halsey LLP

(57) ABSTRACT

An electronic device includes: a detection circuit to detect a voltage difference between both ends of a wiring portion which is at least a portion of a power supply wiring that connects a power supply circuit and a receiver circuit; a current supply circuit to supply a pilot current having a first current value which is smaller than a second current value of a main current to the power supply wiring; and a control circuit to control supply of the pilot current and stop of the supply of the pilot current, to calculate a wiring resistance value of the wiring portion based on a first value of the voltage difference when the supply is stopped, a second value of the voltage difference when the pilot current is supplied, and the first current value and to calculate the second current value based on the first value and the wiring resistance value.

11 Claims, 25 Drawing Sheets

FIG.13

| Temperature | Data Presence/ Absence | Wiring Resistance Value |
|---|---|---|
| 0.0°C | 0 : Absence | 1.000mΩ |
| 0.1°C | 1 : Presence | 1.001mΩ |
| 0.2°C | 0 : Absence | Absence |
| ⋮ | ⋮ | ⋮ |
| 100.0°C | 1 : Presence | 2.000mΩ |

| Temperature | Data Presence/ Absence | Tolerable Resistance Value Range | Statistical Result of Wiring Resistance Value |
|---|---|---|---|
| 0.0°C | 0 : Absence | 1.0mΩ ±10% | 1.000mΩ |
| 0.1°C | 1 : Presence | 1.0mΩ ±10% | 1.001mΩ |
| 0.2°C | 0 : Absence | 1.0mΩ ±10% | Absence |
| ⋮ | ⋮ | ⋮ | ⋮ |
| 100.0°C | 1 : Presence | 2.0mΩ ±10% | 2.000mΩ |

FIG.17

| Temperature | | Data Presence/Absence | Correction Value | | Tolerable Resistance Value Range | Statistical Result of Wiring Resistance Value |
|---|---|---|---|---|---|---|
| Pilot Current Absence | Pilot Current Presence | | Δ°C | ΔmΩ | | |
| 0.0°C | 0.1°C | 0: Absence | 0.1 | 0.001 | 1.0mΩ ±10% | Absence |
| 0.1°C | 0.2°C | 1: Presence | 0.1 | 0.001 | 1.0mΩ ±10% | 1.001mΩ |
| 0.2°C | 0.3°C | 0: Absence | 0.1 | 0.001 | 1.0mΩ ±10% | Absence |
| ... | ... | ... | ... | ... | ... | ... |
| 30.0°C | 30.1°C | 0: Absence | 0.1 | 0.001 | 1.3mΩ ±10% | 1.300mΩ |
| 30.1°C | 30.2°C | 1: Presence | 0.1 | 0.001 | 1.3mΩ ±10% | 1.301mΩ |
| 30.2°C | 30.3°C | 1: Presence | 0.1 | 0.001 | 1.3mΩ ±10% | 1.302mΩ |
| ... | ... | ... | ... | ... | ... | ... |
| 100.0°C | 100.1°C | 1: Presence | 0.1 | 0.001 | 2.0mΩ ±10% | 2.000mΩ |

35

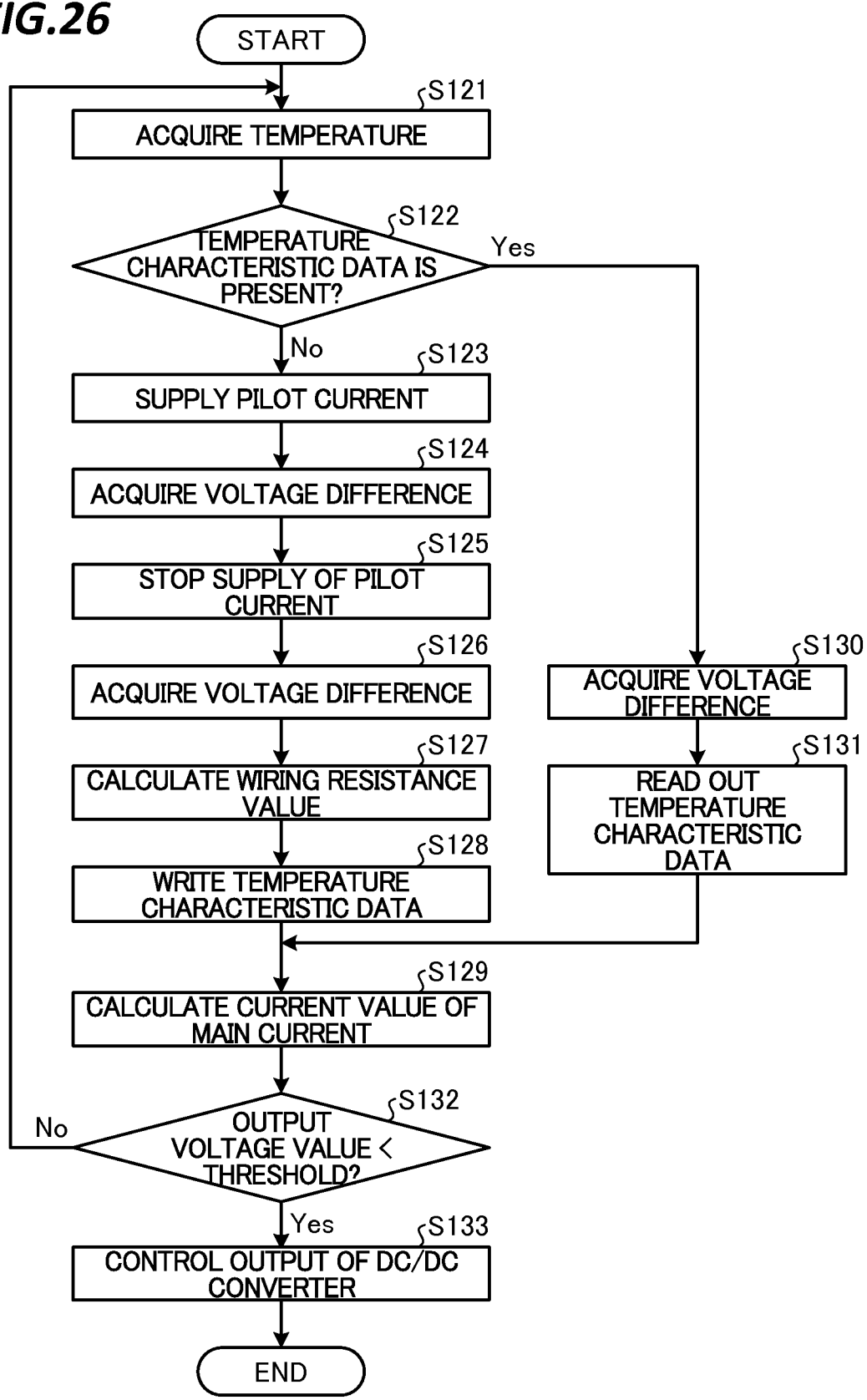

# US 9,335,350 B2

ELECTRONIC DEVICE AND CURRENT MONITORING METHOD

CROSS-REFERENCE TO RELATED APPLICATION

This application is based upon and claims the benefit of priority from the prior Japanese Patent Application No. 2013-147438 filed on Jul. 16, 2013, the entire contents of which are incorporated herein by reference.

FIELD

The present disclosure relates to an electronic device and a current monitoring method.

BACKGROUND

As a conventional current monitoring device and method, a technology has been disclosed in which a resistor is configured using a wiring pattern and a current value is measured based on a resistance value of the resistor and a voltage difference between two points in the resistor. In addition, a technology has been also disclosed in which the resistance value of the resistor formed using the wiring pattern is corrected based on a temperature characteristic which has been measured in advance (see, e.g., Japanese Laid-Open Patent Publication No. 2007-280643). Further, a technology has been also disclosed in which a voltage drop in a reference resistor disposed outside an aging tank is measured so as to measure a current flowing in a semiconductor device within the aging tank (see, e.g., Japanese Laid-Open Patent Publication No. 06-138174).

SUMMARY

According to an aspect of the invention, an electronic device includes: a power supply circuit configured to supply a main current; a receiver circuit configured to be driven by the main current supplied from the power supply circuit; a detection circuit configured to detect a voltage difference occurring between both ends of a wiring portion which is at least a portion of a power supply wiring that connects the power supply circuit and the receiver circuit, by a current flowing in the power supply wiring; a current supply circuit configured to supply a pilot current having a first current value which is smaller than a second current value of the main current to the power supply wiring; and a control circuit configured to control supply of the pilot current and stop of the supply of the pilot current for the current supply circuit, to calculate a wiring resistance value of the wiring portion based on a first value of the voltage difference detected by the detection circuit when the supply of the pilot current is stopped, a second value of the voltage difference detected by the detection circuit when the pilot current is supplied, and the first current value and to calculate the second current value based on the first value of the voltage difference and the wiring resistance value.

The object and advantages of the disclosure will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 is a view illustrating first exemplary temperature characteristic data;

FIG. 15 is a view illustrating second exemplary temperature characteristic data;

FIG. 17 is a view illustrating third exemplary temperature characteristic data;

FIG. 26 is a view illustrating a ninth exemplary current monitoring method.

DESCRIPTION OF EMBODIMENTS

Figure 1:
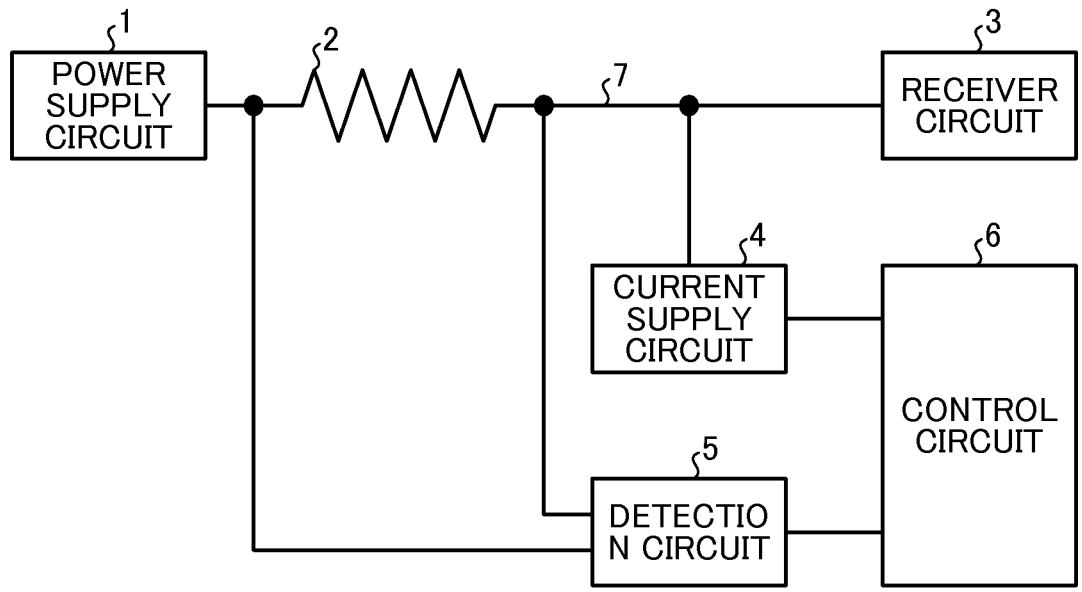
FIG. 1 is a view illustrating a first exemplary electronic device.

As in the recent large scale integrated circuit (LSI), when a large current of about several dozens to 100 A flows into an LSI from a power supply circuit, the resistance value of a resistor varies due to the heat generated from the resistor and as a result, the measurement error of a current value is increased. When the resistance value of the resistor is corrected based on a temperature characteristic, the current value is indirectly obtained with reference to a table that stores measurement results of temperature characteristics. As a result, a deviation may be caused between an actual current value and a measured value. That is, it is difficult to correctly measure the current flowing from a power supply circuit into a receiver circuit of, for example, an LSI.

Hereinafter, an exemplary embodiment for an electronic device and a current monitoring method capable of measuring a current flowing from a power supply circuit into a receiver circuit will be described in detail with reference to the accompanying drawings. Hereinafter, in the following descriptions of each of exemplary embodiments, the same elements will be denoted by the same reference numerals and overlapping descriptions will be omitted.

First Embodiment of Electric Device

Figure 2:
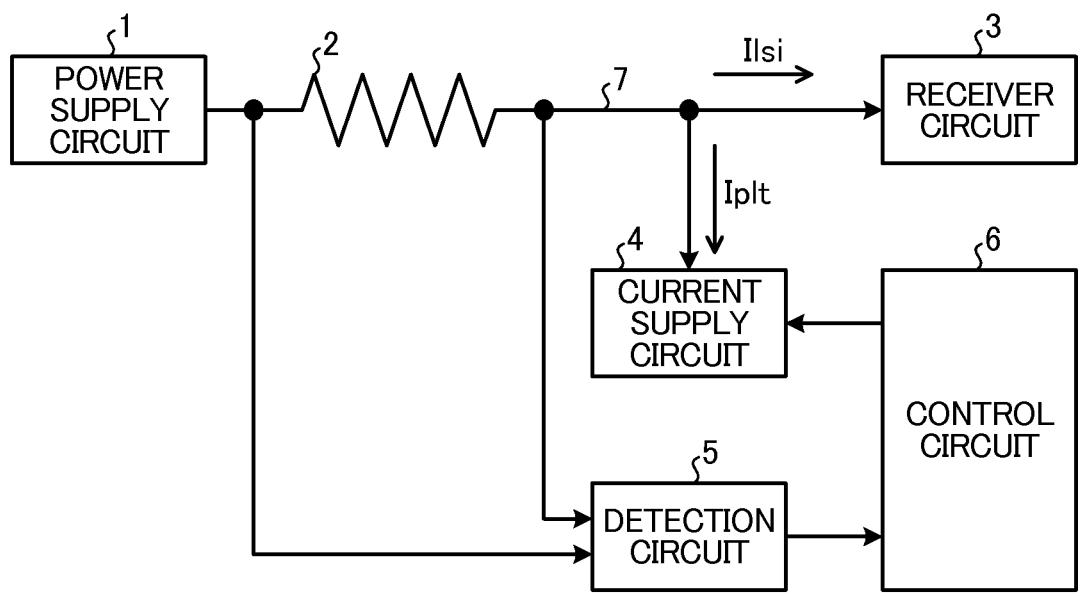
FIG. 2 is a view illustrating the flow of a signal and a current in the electronic device illustrated in FIG. 1.

FIG. 1 is a view illustrating the block diagram of a first exemplary electronic device. FIG. 2 is a view illustrating the flow of a signal and a current in the electronic device illustrated in FIG. 1. As illustrated in FIGS. 1 and 2, the electronic device includes a power supply circuit 1, a receiver circuit 3, a current supply circuit 4, a detection circuit 5, and a control circuit 6.

The power supply circuit 1 and the receiver circuit 3 are connected with each other through a power supply wiring 7. The power supply circuit 1 supplies a main current to the receiver circuit 3 through the power supply wiring 7. The main current flows into the receiver circuit 3. The receiver circuit 3 is driven by the main current supplied from the power supply circuit 1. In FIG. 2, the main current is indicated as Ilsi.

The current supply circuit 4 is connected to a point of the power supply wiring 7 between the wiring portion 2 of the power supply wiring 7 and the receiver circuit 3. The current supply circuit 4 is connected to the control circuit 6. Based on a control signal from the control circuit 6, the current supply circuit 4 either supplies the pilot current, or stops the supply of the pilot current. The current value of the pilot current is smaller than the current value of the main current. In FIG. 2, the pilot current is indicated as Iplt.

The pilot current supplied by the current supply circuit 4 flows out from the power supply wiring 7. That is, in a state where the pilot current is supplied to the power supply wiring 7 by the current supply circuit 4, among the currents flowing in the power supply wiring 7, the main current flows into the receiver circuit 3 and the pilot current flows into the current supply circuit 4.

The detection circuit 5 is connected to the both ends of the wiring portion 2 which is at least a portion of the power supply wiring 7. When a current flows through the power supply wiring 7, a voltage drop occurs in the wiring portion 2 of the power supply wiring 7. The detection circuit 5 detects a voltage difference occurring between the both ends of the wiring portion 2 by the voltage drop, based on the voltages at the both ends of the wiring portion 2. The detection circuit 5 outputs a signal corresponding to a detected value of the voltage difference to the control circuit 6.

One end of the wiring portion 2 of the power supply wiring 7 is connected to the power supply circuit 1 and the other end is connected to the receiver circuit 3. It is desirable that the one end of the wiring portion 2 of the power supply wiring 7 is close to the power supply circuit 1 and the other end is close to the receiver circuit 3. The detection circuit 5 is connected to the one end and the other end. Then, since the substantially entire power supply wiring 7 between the power supply circuit 1 and the receiver circuit 3 becomes the wiring portion 2, the wiring resistance value of the wiring portion 2 becomes large enough for measuring the main current.

The control circuit 6 is connected to the current supply circuit 4 and the detection circuit 5. The control circuit 6 outputs a control signal to the current supply circuit 4 so as to control the supply and stop of the pilot current in the current supply circuit 4.

The control circuit 6 receives the signal corresponding to the detected value of the voltage difference from the detection circuit 5. The control circuit 6 calculates the wiring resistance value of the wiring portion 2, based on the value of the voltage difference detected by the detection circuit 5 when the supply of the pilot current is stopped, the value of the voltage difference detected by the detection circuit 5 when the pilot current is supplied, and the current value of the pilot current. The control circuit 6 calculates the current value of the main current flowing from the power supply circuit 1 into the receiver circuit 3, based on the value of the voltage difference detected by the detection circuit 5 at the time of stopping the supply of the pilot current and the wiring resistance value of the wiring portion 2.

In the electronic device illustrated in FIG. 1, each of the power supply circuit 1, the receiver circuit 3, the current supply circuit 4, and the detection circuit 5 is implemented by hardware. However, while the control circuit 6 may be implemented by hardware, each function implemented by the control circuit 6 may well be implemented by a processing of software. Descriptions will be made on an example of a hardware configuration when each function of the control circuit 6 is implemented by the processing of software.

Figure 3:
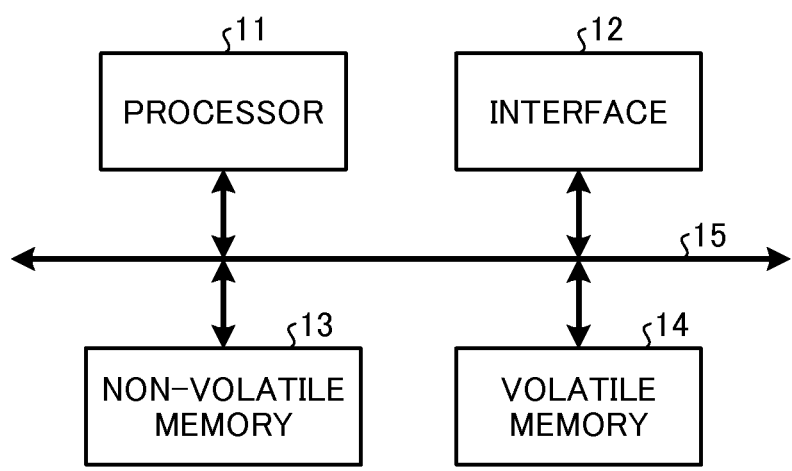
FIG. 3 is a view illustrating an exemplary hardware configuration of a control circuit in the electronic device illustrated in FIG. 1.

FIG. 3 is a view illustrating an example of a hardware configuration in the electronic device illustrated in FIG. 1. As illustrated in FIG. 3, the control circuit 6 of the electronic device includes, for example, a processor 11, an interface 12, a non-volatile memory 13, and a volatile memory 14. The processor 11, the interface 12, the non-volatile memory 13, and the volatile memory 14 may be connected to a bus 15.

The processor 11 processes a program that implements a current monitoring method to be described later. As such, each function of the control circuit 6 in the electronic device illustrated in FIG. 1 is implemented. As an example of the processor 11, a programmable logic device such as, for example, a CPU (Central Processing Unit), a DSP (Digital Signal Processor), an ASIC (Application Specific Integrated Circuit), or an FPGA (Field Programmable Gate Array) may be exemplified.

The non-volatile memory 13 stores a program that implements a booting program or a current monitoring method to be described later. When the processor 11 is a programmable logic device, the non-volatile memory 13 may store circuit information of the programmable logic device. As an example of the non-volatile memory 13, a ROM (Read Only Memory) such as, for example, a mask ROM, an EEPROM (Electrically Erasable Programmable Read Only Memory), or a flash memory, may be exemplified.

The volatile memory 14 is used as a work area of the processor 11. The volatile memory 14 maintains a program read out from the non-volatile memory 13. As an example of the volatile memory 14, a RAM (Random Access Memory) such as, for example, a DRAM (Dynamic Random Access Memory) or an SRAM (Static Random Access Memory), may be exemplified.

The interface 12 takes a role of the output of the control signal that controls the supply and stop of the pilot current with respect to the current supply circuit 4. The interface 12 also takes a role of the input of the signal corresponding to the detected value of the voltage difference input from the detection circuit 5.

First Embodiment of Current Monitoring Method

Figure 4:
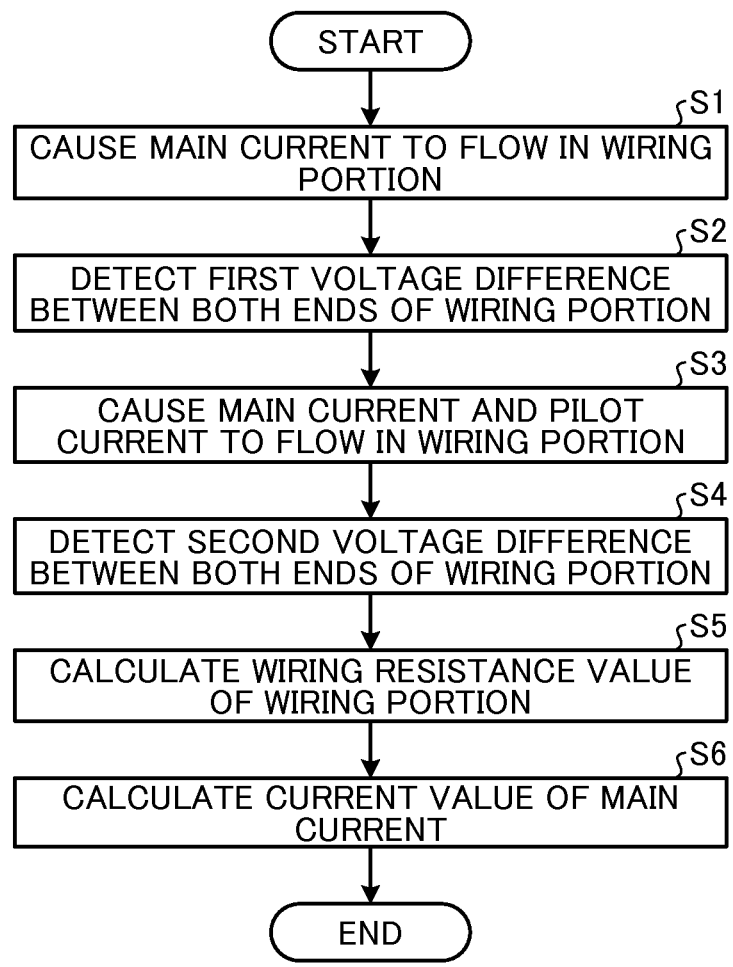
FIG. 4 is a view illustrating a first exemplary current monitoring method.

FIG. 4 is a view illustrating a first exemplary current monitoring method. The current monitoring method illustrated in FIG. 4 may be carried out in the electronic device illustrated in FIG. 1. In the present exemplary embodiment, descriptions will be made while assuming that the current monitoring method illustrated in FIG. 4 is carried out in the electronic device illustrated in FIG. 1.

As illustrated in FIG. 4, when the current monitoring method is initiated, the power supply circuit 1 is turned ON such that the main current flows from the power supply circuit 1 to the receiver circuit 3 through the wiring portion 2 of the power supply wiring 7 (operation S1). At this time, the current supply circuit 4 stops the supply of the pilot current in response to the control signal from the control circuit 6.

Subsequently, when the main current flows, the detection circuit 5 detects a first voltage difference occurring between the both ends of the wiring portion 2 of the power supply wiring 7. In addition, the detection circuit 5 outputs a signal based on the detected value of the first voltage difference to the control circuit 6 (operation S2).

Subsequently, the control circuit 6 outputs a control signal to the current supply circuit 4 such that the current supply circuit 4 supplies the pilot current. As a result, the main current and the pilot current which is smaller than the main current flow in the wiring portion 2 of the power supply wiring 7 (operation S3).

Subsequently, the detection circuit 5 detects a second voltage difference occurring between the both ends of the wiring portion 2 of the power supply wiring 7 when the main current and the pilot current flow in the wiring portion 2. In addition, the detection circuit 5 outputs a signal based on the detected value of the second voltage difference to the control circuit 6 (operation S4).

Subsequently, the control circuit 6 calculates the value of the first voltage difference and the value of second voltage difference, based on the output signal of the detection circuit 5. In addition, the control circuit 6 calculates the wiring resistance value of the wiring portion 2 of the power supply wiring 7, based on the value of the first voltage difference, the value of the second voltage difference, and the current value of the pilot current (operation S5).

Subsequently, the control circuit 6 calculates the current value of the main current based on the value of the first voltage difference and the wiring resistance value (operation S6). Then, a series of operations in the current monitoring method are terminated. Meanwhile, operations S3 and S4 may be performed prior to performing operations S1 and S2.

According to the electronic device illustrated in FIG. 1 or the current monitoring method illustrated in FIG. 4, since the current value of the pilot current is smaller than that of the main current, the caloric value (e.g., a heating value) generated when the pilot current flows in the current supply circuit 4 becomes smaller than the caloric value generated when the main current and the pilot current flow in the wiring portion 2 of the power supply wiring 7. As a result, since the variation of the resistance value of the current supply circuit 4 caused by the temperature becomes smaller than the variation of the wiring resistance value of the wiring portion 2 of the power supply wiring 7, the current supply circuit 4 becomes a constant-current circuit which is less affected by temperature. That is, the current supply circuit 4 may be able to flow a pilot current having a constant value without being affected by temperature. Accordingly, the detection circuit 5 may detect the voltage difference between the both ends of the wiring portion 2 of the power supply wiring 7 when the pilot current flows, substantially without being affected by temperature. Further, the control circuit 6 may calculate the wiring resistance value of the wiring portion 2 substantially without being affected by temperature and calculate the current value of the main current based on the wiring resistance value. That is, the electronic device may measure the main current flowing from the power supply circuit 1 into the receiver circuit 3.

Second to tenth exemplary electronic devices to be described below are examples of the electronic devices to which the first exemplary electronic device described above is applied.

Second Embodiment of Electronic Device

Figure 5:
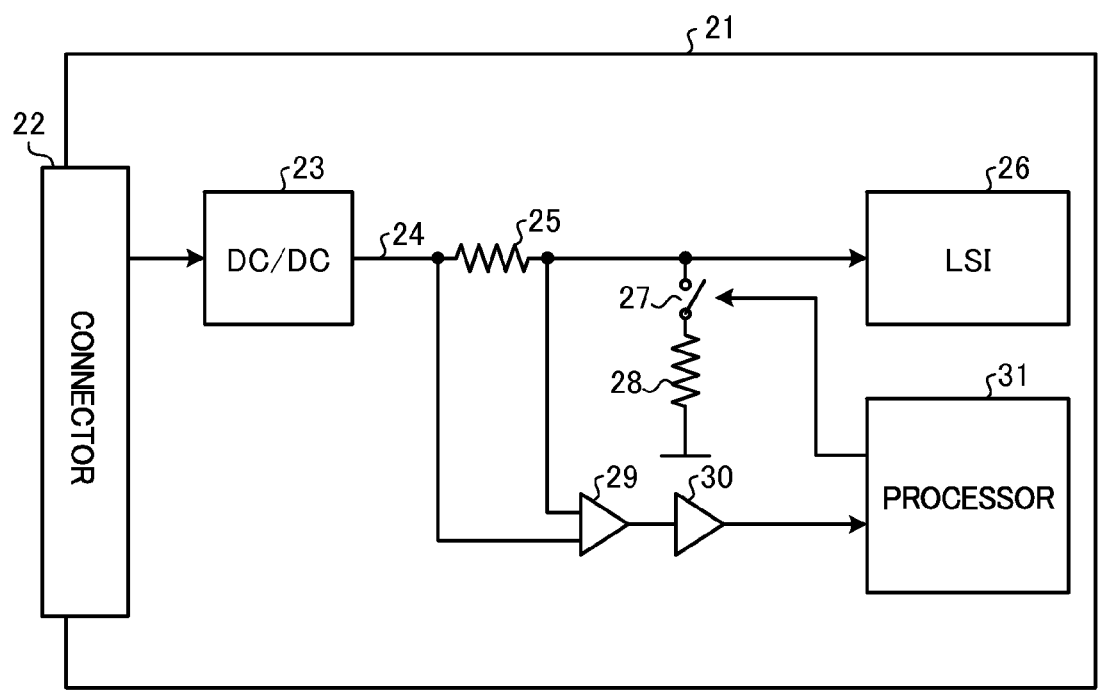
FIG. 5 is a view illustrating a second exemplary electronic device.

FIG. 5 is a view illustrating the block diagram of a second exemplary electronic device. As illustrated in FIG. 5, the electronic device includes a connector 22, a DC/DC converter 23, a power supply wiring 24, a wiring portion 25 of the power supply wiring 24, an LSI 26, a switch 27, a pilot resistor 28, a differential amplifier 29, an ADC (Analog-to-Digital Converter) 30, and a processor 31. The connector 22, the DC/DC converter 23, the LSI 26, the switch 27, the pilot resistor 28, the differential amplifier 29, the ADC 30, and the processor 31 may be mounted on a printed circuit board 21. The power supply wiring 24 and the wiring portion 25 of the power supply wiring 24 may be formed on the printed circuit board 21.

The connector 22 is connected, for example, to another printed circuit board, a backplane, or a connector of a rack which are not illustrated.

An input terminal of the DC/DC converter 23 is connected to the connector 22. The DC/DC converter 23 converts a DC voltage supplied from, for example, another printed circuit board connected to the connector 22 through the connector 22 into a DC voltage suitable for driving the LSI 26 and outputs the converted DC voltage. For example, the DC/DC converter 23 may be supplied with a 12V DC voltage from the connector 22, convert the 12V DC voltage into a 1.0V DC voltage, and output the 1.0V DC voltage. The DC/DC converter 23 is an example of the power supply circuit 1.

The power supply wiring 24 is connected to a power output terminal of the DC/DC converter 23 and the power input terminal of the LSI 26. Accordingly, the main current output from the DC/DC converter 23 flows into the LSI 26 via the power supply wiring 24.

The LSI 26 is driven by the main current supplied from the DC/DC converter 23. The LSI 26 is an example of the receiver circuit 3.

One end of the switch 27 is connected with the power supply wiring 24 between the wiring portion 25 of the power supply wiring 24 and the power input terminal of the LSI 26. One end of the pilot resistor 28 is connected to the other end of the switch 27. The other end of the pilot resistor 28 is connected to, for example, a ground. The switch 27 is switched between ON and OFF based on a control signal output from the processor 31.

When the switch 27 is in the ON state, the pilot resistor 28 is connected with the power supply wiring 24 between the wiring portion 25 of the power supply wiring 24 and the power input terminal of the LSI 26. As a result, the main current and the pilot current flow in the wiring portion 25 of the power supply wiring 24. The pilot current flows from the wiring portion 25 of the power supply wiring 24 to the pilot resistor 28. The resistance value of the pilot resistor 28 is known and larger than the wiring resistance value of the wiring portion 25 of the power supply wiring 24. Accordingly, the current value of the pilot current is smaller than that of the main current.

When the switch 27 is in the OFF state, the pilot resistor 28 is disconnected and separated from the power supply wiring 24. Therefore, the pilot current does not flow in the wiring portion 25 of the power supply wiring 24 but the main current flows therein. The combination of the switch 27 and the pilot resistor 28 may be included in the current supply circuit 4.

In the power supply wiring 24, one input terminal of the differential amplifier 29 is connected between the power output terminal of the DC/DC converter 23 and the wiring portion 25 of the power supply wiring 24. In the power supply wiring 24, the other input terminal of the differential amplifier 29 is connected between the power input terminal of the LSI 26 and the wiring portion 25 of the power supply wiring 24. When current flows in the wiring portion 25 of the power supply wiring 24, a voltage drop occurs in the wiring portion 25. The differential amplifier 29 detects and outputs a voltage difference occurring between the both ends of the wiring portion 25 caused by the voltage drop.

The ADC 30 is connected to an output terminal of the differential amplifier 29. The ADC 30 converts an analog signal output from the differential amplifier 29 into a digital signal and outputs the digital signal to the processor 31. The combination of the differential amplifier 29 and the ADC 30 is an example of the detection circuit 5.

The processor 31 is connected to the switch 27 and the output terminal of the ADC 30. The processor 31 outputs a control signal to the switch 27 so as to cause the pilot current to flow in the pilot resistor 28 or stop the flow of the pilot current in the pilot resistor 28.

The processor 31 receives a digital signal corresponding to a detected value of the voltage difference from the ADC 30. The processor 31 calculates the wiring resistance value of the wiring portion 25, based on the information obtained by the digital signal received from the ADC 30 when the pilot current does not flow, the information obtained by the digital signal received from the ADC 30 when the pilot current flows, and the current value of the pilot current. The processor 31 may calculate the current value of the pilot current based on the resistance value of the pilot resistor 28 and the voltage value of the power input terminal of the LSI 26.

The processor 31 calculates the current value of the main current flowing from the DC/DC converter 23 to the LSI 26, based on the information obtained by the digital signal received from the ADC 30 when the pilot current does not flow and the wiring resistance value of the wiring portion 25. The processor 31 may always or regularly calculate the current value of the main current. The processor 31 may be a CPU, a DSP, an ASIC, or an FPGA. The processor 31 is an example of the control circuit 6.

Figure 6:
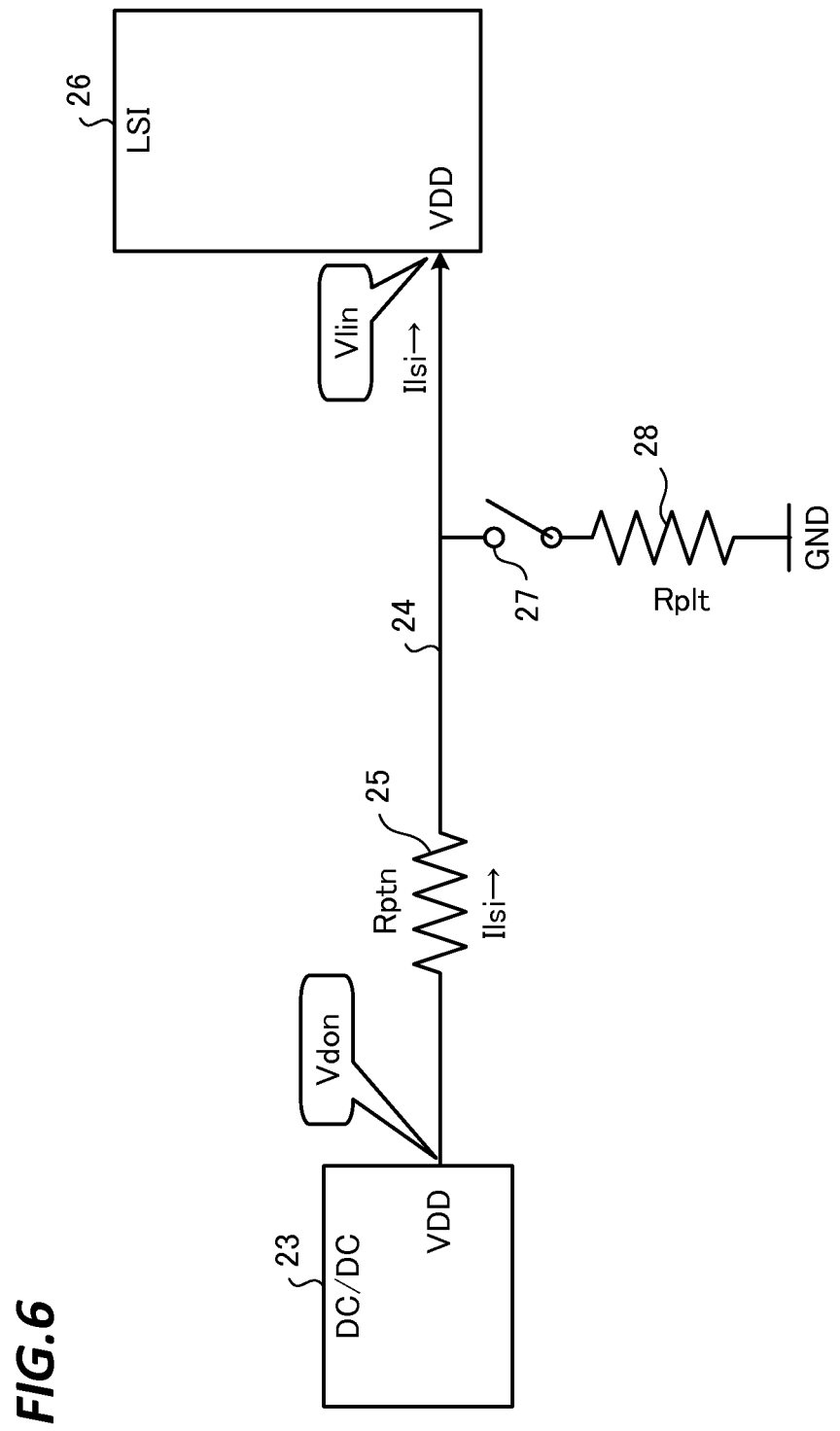
FIG. 6 is a view for describing the second exemplary electronic device in a case where a switch is in an OFF state.
Figure 7:
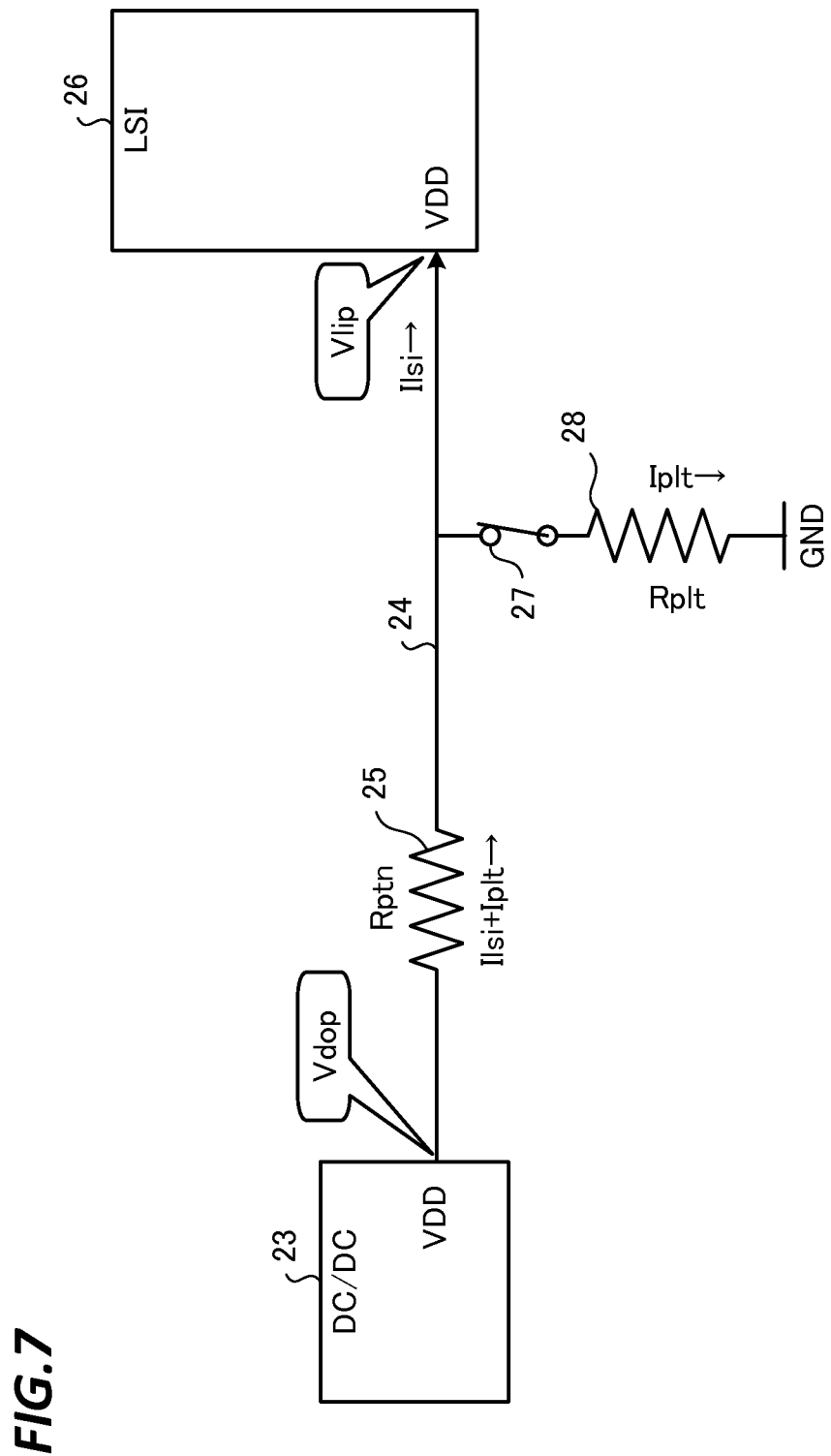
FIG. 7 is a view for describing the second exemplary electronic device in a case where the switch is in an ON state.

FIGS. 6 and 7 are views for describing the second exemplary electronic device, in which FIG. 6 illustrates a case where the switch 27 is in the OFF state and FIG. 7 illustrates a case where the switch 27 is in the ON state. It is assumed that the current value of the main current is Ilsi and the current value of the pilot current is IpIt. In addition, it is assumed that the wiring resistance value of the wiring portion 25 of the power supply wiring 24 is Rptn and the resistance value of the pilot resistor 28 is Rplt.

As illustrated in FIG. 6, it is assumed that, when the switch 27 is in the OFF state, the voltage value of the power output terminal VDD of the DC/DC converter 23 is Vdon, and the voltage value of the power input terminal VDD of the LSI 26 is Vlin. In addition, as illustrated in FIG. 7, it is assumed that, when the switch 27 is in the ON state, the voltage value of the power output terminal VDD of the DC/DC converter 23 is Vdop, and the voltage value of the power input terminal VDD of the LSI 26 is Vlip.

Figure 8:
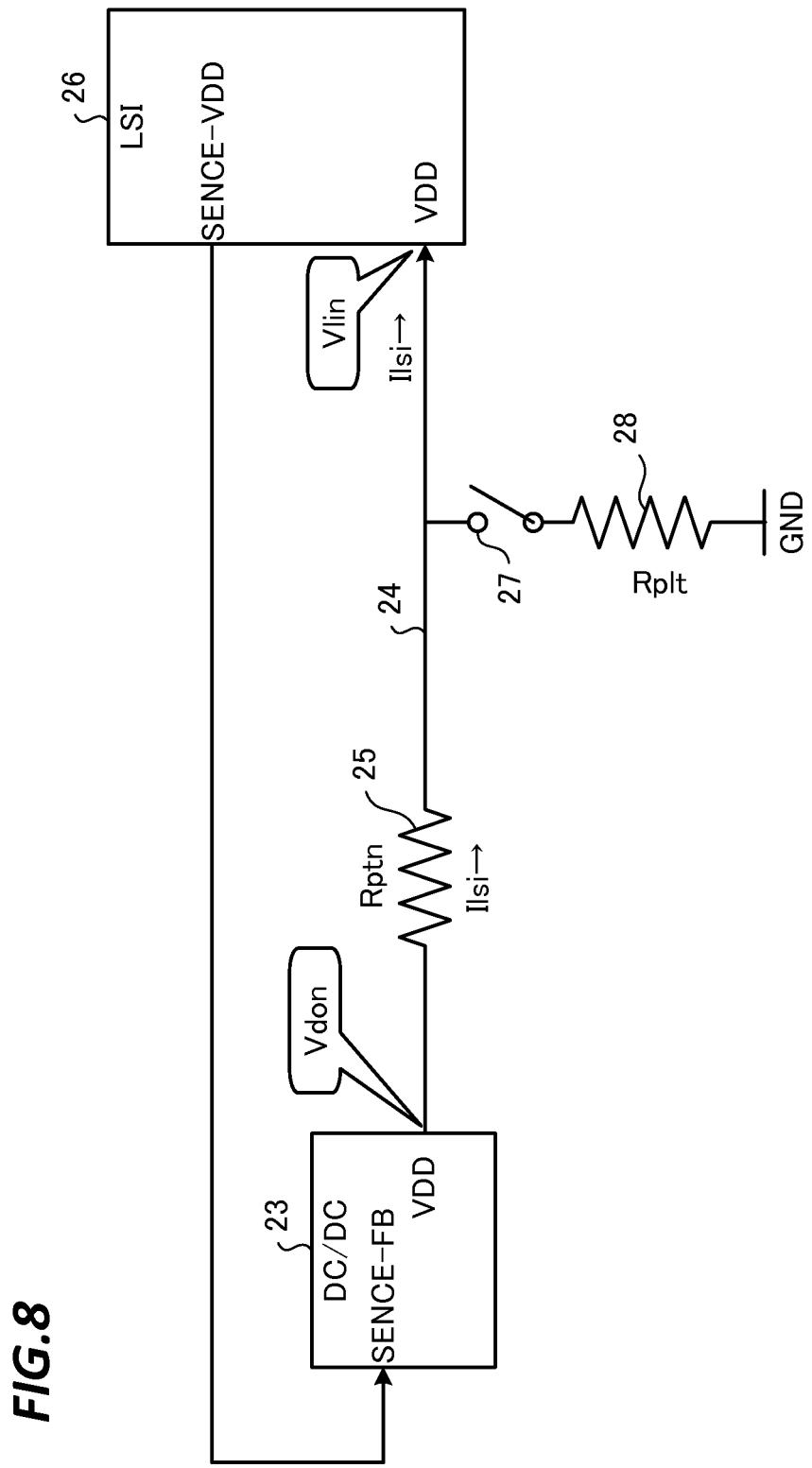
FIG. 8 illustrates an example of performing a feedback control of a power supply voltage in the second exemplary electronic device in a case where the switch is in the OFF state.
Figure 9:
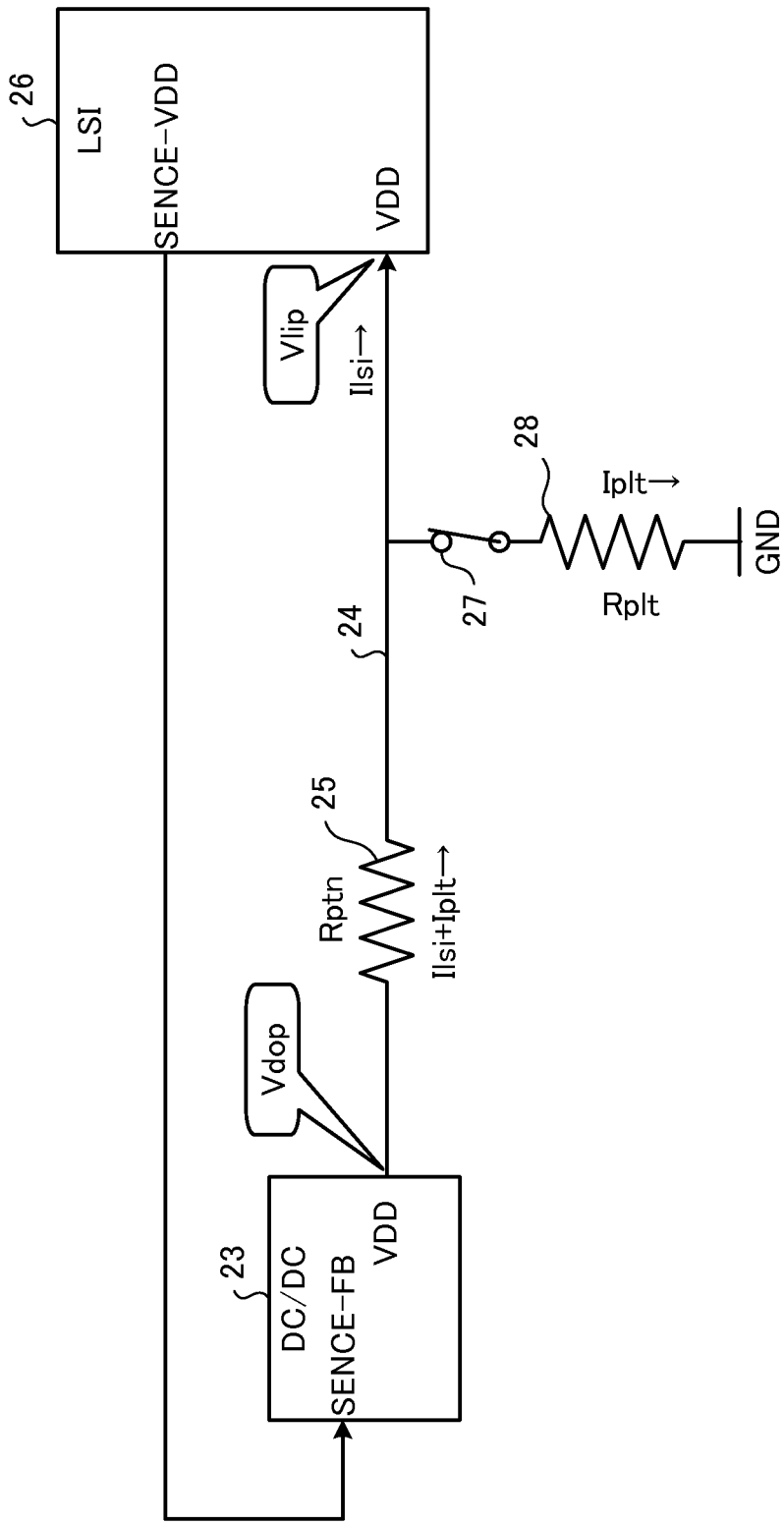
FIG. 9 illustrates the example of performing the feedback control of the power supply voltage in the second exemplary electronic device in a case where the switch is in the ON state.

FIGS. 8 and 9 illustrate an example of performing a feedback control of a power supply voltage in the second exemplary electronic device, in which FIG. 8 illustrates a case where the switch 27 is in the OFF state and FIG. 9 illustrates a case where the switch 27 is in the ON state.

As illustrated in FIGS. 8 and 9, in some cases, the voltage of the power input terminal VDD of the LSI 26 may be fed back from a SENCE voltage output terminal SENCE-VDD of the LSI 26 to a SENCE voltage input terminal SENCE-FB of the power supply circuit such as the DC/DC converter 23, as a SENCE voltage. In such a case, the power supply circuit such as the DC/DC converter 23 corrects the voltage drop occurring in a current path such as a wiring, based on the voltage value of the SENCE voltage input terminal SENCE-FB so as to maintain the voltage value of the power output terminal VDD of the DC/DC converter 23.

As is apparent from the comparison of FIGS. 6 to 9, it is not necessary to consider whether or not there is a feedback control of the SENCE voltage when the processor 31 calculates the current value IpIt of the pilot current, the wiring resistance value Rptn of the wiring portion 25, and the current value Ilsi of the main current. That is, even if there is a feedback control of the SENCE, the processor 31 may calculate the current value IpIt of the pilot current, the wiring resistance value Rptn of the wiring portion 25, and the current value Ilsi of the main current by performing the same operations. Accordingly, the foregoing and following descriptions for the exemplary embodiments include both of the cases where there is a feedback control of the SENCE voltage and the case where there is no feedback control of the SENCE voltage.

Descriptions will be made on the operation contents in the processor 31. Parameters will be defined as follows.

It is assumed that the voltage value of the power output terminal VDD of the DC/DC converter 23 is Vdon when the switch 27 is in the OFF state, that is, when the pilot current does not flow. It is assumed that the voltage value of the power output terminal VDD of the DC/DC converter 23 is Vdop when the switch 27 is in the ON state, that is, when the pilot current flows.

It is assumed that the voltage value of the power input terminal VDD of the LSI 26 is Vlin when the pilot current does not flow. It is assumed that the voltage value of the power input terminal VDD of the LSI 26 is Vlip when the pilot current flows. Each of the values of Vdon, Vdop, Vlin and Vlip is known.

It is assumed that the wiring resistance value of the wiring portion 25 of the power supply wiring 24 is Rptn. It is also assumed that the resistance value of the pilot resistor 28 is Rplt. It is further assumed that the current value of the main current flowing into the LSI 26 is Ilsi. It is yet further assumed that the current value of the pilot current flows in the pilot resistor 28 is IpIt. Each of the values of Rptn, Ilsi, and IpIt is unknown. The value of Rplt is known.

The voltage difference between the both ends of the wiring portion 25 of the power supply wiring 24 when the pilot current does not flow is expressed by the following Equation (1). In addition, the voltage difference between the both ends of the wiring portion 25 of the power supply wiring 24 when the pilot current flows is expressed by the following Equation (2).

$$Vdon-Vlin=Ilsi \times Rptn \tag{1}$$

$$Vdop-Vlip=(Ilsi+IpIt) \times Rptn \tag{2}$$

When the pilot current flows in the pilot resistor 28, the following Equation (3) is established. When Equation (3) is modified, Equation (4) may be obtained. Since each of the values of Vlip and Rplt is known, the processor 31 may calculate the value of IpIt.

$$Vlip = IpIt \times Rplt \quad (3)$$

$$IpIt = Vlip/Rplt \quad (4)$$

The voltage drop amount when the main current and the pilot current flow in the wiring portion 25 of the power supply wiring 24 becomes larger than the voltage drop amount when the pilot current does not flow but the main current flows in the wiring portion 25 of the power supply wiring 24 by an amount obtained when the pilot current flows. Accordingly, the following Equation (5) is established and the processor 31 may calculate the wiring resistance value Rptn of the wiring portion 25 of the power supply wiring 24.

$$Rptn = ((Vdop - Vlip) - (Vdon - Vlin))/IpIt \quad (5)$$

Equation (1) may be modified to obtain the following Equation (6). Accordingly, the processor 31 may calculate the current value of the main current from Equation (5) and Equation (6).

$$Ilsi = (Vdon - Vlin)/Rptn \quad (6)$$

As an example, it is assumed that, for example, when the temperature of the wiring portion 25 of the power supply wiring 24 is 0° C., Vdon is 1.1 V, Vlin is 1.0 V, and the voltage difference between Vdon and Vlin is 0.1 V. In addition, it is assumed that Vdop is 1.101 V, Vlip is 1.0 V, and the difference between Vdop and Vlip is 0.101 V. Further, assuming that Rplt is 1Ω, IpIt will be 1 A from Equation (4) described above. Accordingly, Rptn will be 1 mΩ from Equation (5) described above and Ilsi will be 100 A from Equation (6) described above.

As an example, it is assumed that, for example, when a current flows in the wiring portion 25 of the power supply wiring 24, the temperature of the wiring portion 25 becomes 100° C. In such a case, it is assumed that Vdon is 1.2 V, Vlin is 1.0 V, and the voltage difference between Vdon and Vlin is 0.2. Further, it is assumed that Vdop is 1.202 V, Vlip is 1.0 V, and the voltage difference between Vdop and Vlip is 0.202 V. The current value of the pilot current flowing in the pilot resistor 28 is sufficiently smaller than the current value of a current corresponding to the currents flowing in the wiring portion 25 of the power supply wiring 24, i.e. smaller than the sum of the main current and the pilot current. Therefore, even if the pilot current flows in the pilot resistor 28, the resistance value of the pilot resistor 28 does not change substantially from, for example, the resistance value when the temperatures is 0° C. That is, Rplt may be considered as 1Ω. Accordingly, IpIt will be 1 A from Equation (4) described above, Rptn will be 2 mΩ from Equation (5) described above, and Ilsi will be 100 A from Equation (6) described above.

Second Embodiment of Current monitoring Method

Figure 10:
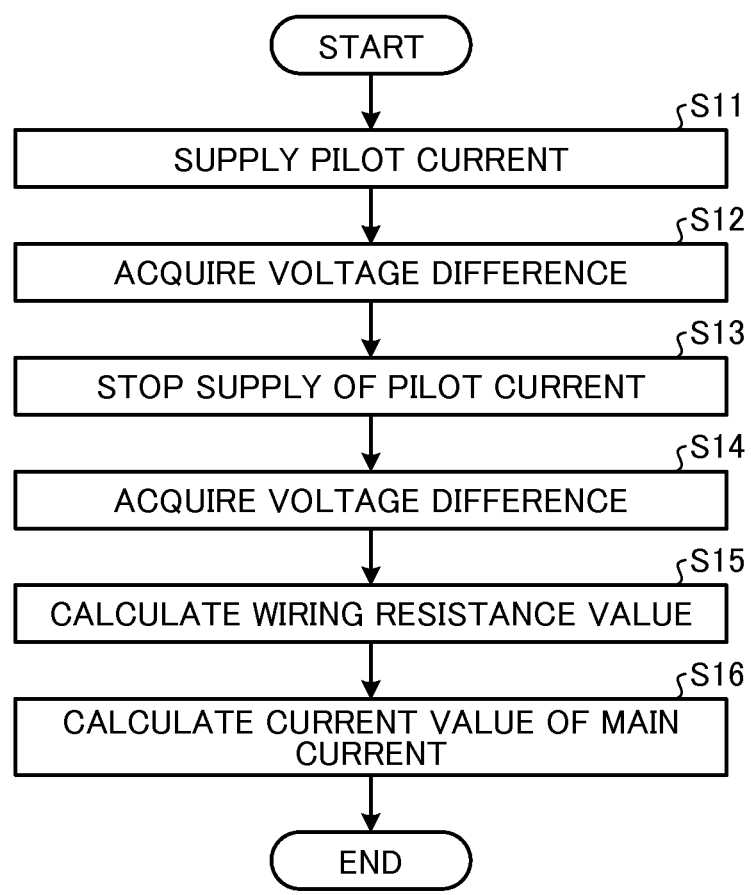
FIG. 10 is a view illustrating a second exemplary current monitoring method.

FIG. 10 is a view illustrating a second exemplary current monitoring method. The current monitoring method of FIG. 10 may be carried out, for example, in the electronic device illustrated FIG. 5.

As illustrated in FIG. 10, when the current monitoring method is initiated, in the electronic device illustrated in FIG. 5, the processor 31 outputs a control signal to turn ON the switch 27 so as to cause the pilot current to flow. As a result, since the switch 27 is brought into the ON state, the pilot current flows in the wiring portion 25 of the power supply wiring 24 and the pilot resistor 28 (operation S11). Accordingly, the main current and the pilot current flow in the wiring portion 25 of the power supply wiring 24.

The differential amplifier 29 detects and outputs the voltage difference occurring between the both ends of the wiring portion 25 of the power supply wiring 24 when the main current and the pilot current flow in the wiring portion 25 of the power supply wiring 24. The ADC 30 converts an analog signal output from the differential amplifier 29 into a digital signal and delivers the digital signal to the processor 31. Thus, the processor 31 obtains the voltage between the both ends of the wiring portion 25 when the main current and the pilot current flow in the wiring portion 25 of the power supply wiring 24 (operation S12).

Subsequently, the processor 31 outputs a control signal to turn OFF the switch 27 so as to cause the pilot current not to flow. As a result, since the switch 27 is brought into the OFF state, the pilot current does not flow (operation S13). Accordingly, only the main current flows in the wiring portion 25 of the power supply wiring 24.

The differential amplifier 29 detects and outputs the voltage difference occurring between the both ends of the wiring portion 25 of the power supply wiring 24 when the main current flows. The ADC 30 converts an analog signal output from the differential amplifier 29 into a digital signal and delivers the digital signal to the processor 31. Thus, the processor 31 obtains the voltage between the both ends of the wiring portion 25 when only the main current flows in the wiring portion 25 of the power supply wiring 24 (operation S14).

Subsequently, the processor 31 calculates the current value of the pilot current from Equation (4) described above and calculates the wiring resistance value of the wiring portion 25 of the power supply wiring 24 from Equation (5) described above (operation S15).

Subsequently, the processor 31 calculates the current value of the main current based on the wiring resistance value calculated at operation S15 and from Equation (6) described above (operation S16). Then, a series of operations in the current monitoring method is terminated. Meanwhile, operations S13 and S14 may be performed prior to operations S11 and S12.

According to the electronic device illustrated in FIG. 5 and the current monitoring method illustrated in FIG. 10, since the current value of the pilot current is smaller than that of the main current, the caloric value when the pilot current flows in the pilot resistor 28 becomes smaller than the caloric value when the main current and the pilot current flow in the wiring portion 25 of the power supply wiring 24. As a result, since the variation of the resistance value of the pilot resistor 28 caused by temperature becomes smaller than the variation of the wiring resistance value of the wiring portion 25 of the power supply wiring 24, the pilot resistor 28 becomes a constant-current circuit which is less affected by temperature. That is, the pilot resistor 28 may cause a pilot current, of which the current value is constant, to flow, substantially without being affected by temperature. Accordingly, the differential amplifier 29 may detect the voltage difference between the both ends of the wiring portion 25 of the power supply wiring 24 when the pilot current flows, substantially without being affected by temperature. Further, the processor 31 may calculate the wiring resistance value of the wiring portion 25, substantially without being affected by temperature and calculate the current value of the main current based on the wiring resistance value. That is, the electronic device may measure the main current flowing from the DC/DC converter 23 into the LSI 26.

Third Embodiment of Electronic Device

Figure 11:
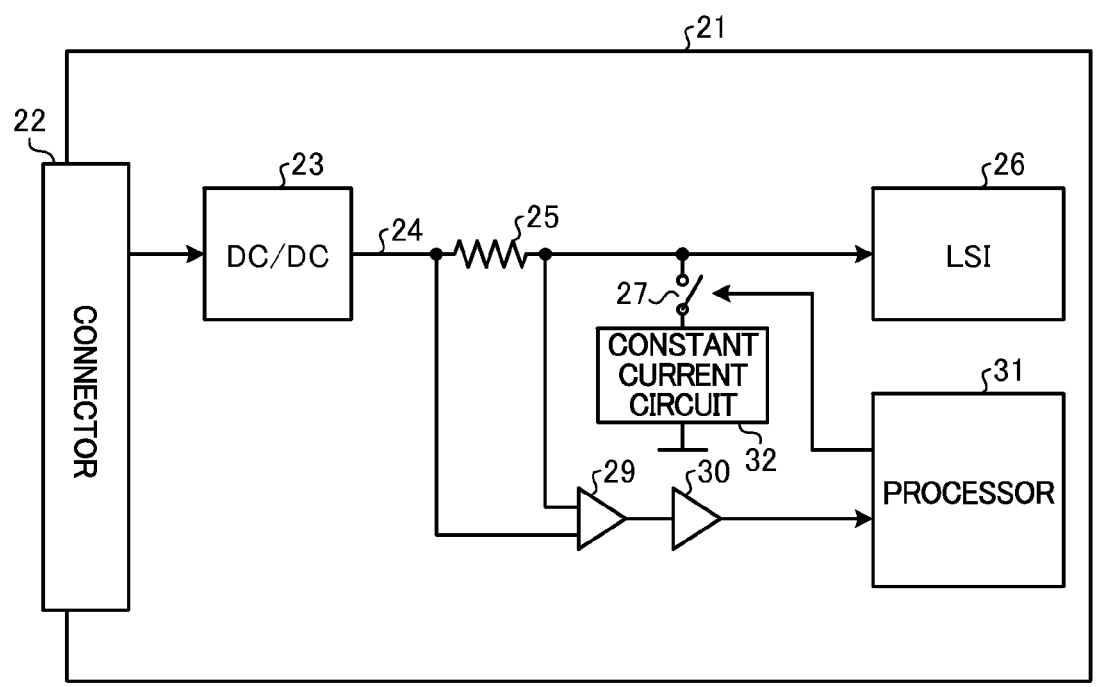
FIG. 11 is a view illustrating a third exemplary electronic device.

FIG. 11 is a view illustrating a third exemplary electronic device. As illustrated in FIG. 11, the third exemplary electronic device includes a constant current circuit 32 instead of the pilot resistor 28 as in the second example of the electronic device illustrated in FIG. 5.

The constant current circuit 32 is connected between the switch 27 and, for example, a ground. The constant current circuit 32 causes a pilot current having a constant current value to flow therein when the switch 27 is in the ON state. Because the other configuration is the same as the second exemplary electronic device illustrated in FIG. 5, overlapping descriptions thereof will be omitted.

In the third exemplary electronic device, since the current value of the pilot current is known, the operation of Equation (4) described above becomes unnecessary in the above described operation contents of the processor 31. That is, by acquiring, from the ADC 30, the voltage difference between the both ends of the power supply wiring 24 of the wiring portion 25 when the pilot current does not flow therein and the voltage difference between the both ends of the wiring portion 25 when the pilot current flows therein, the processor 31 may calculate the wiring resistance value of the wiring portion 25 from Equation (5) described above. In addition, the processor 31 may calculate the current value of the main current from Equation (6) described above.

Since the current monitoring method carried out in the electronic device illustrated in FIG. 11 is the same as the second exemplary current monitoring method illustrated in FIG. 10 except that the processor 31 does not perform an operation of calculating the current value of the pilot current, overlapping descriptions will be omitted.

According to the electronic device illustrated in FIG. 11, since the circuit that causes the pilot current to flow is the constant current circuit 32, a surge may be suppressed when the pilot current flows. Accordingly, the current value of the main current may be calculated with higher accuracy. In addition, the LSI 26 connected to the DC/DC converter 23 may be suppressed from malfunctioning by the surge.

Fourth Embodiment of Electronic Device

Figure 12:
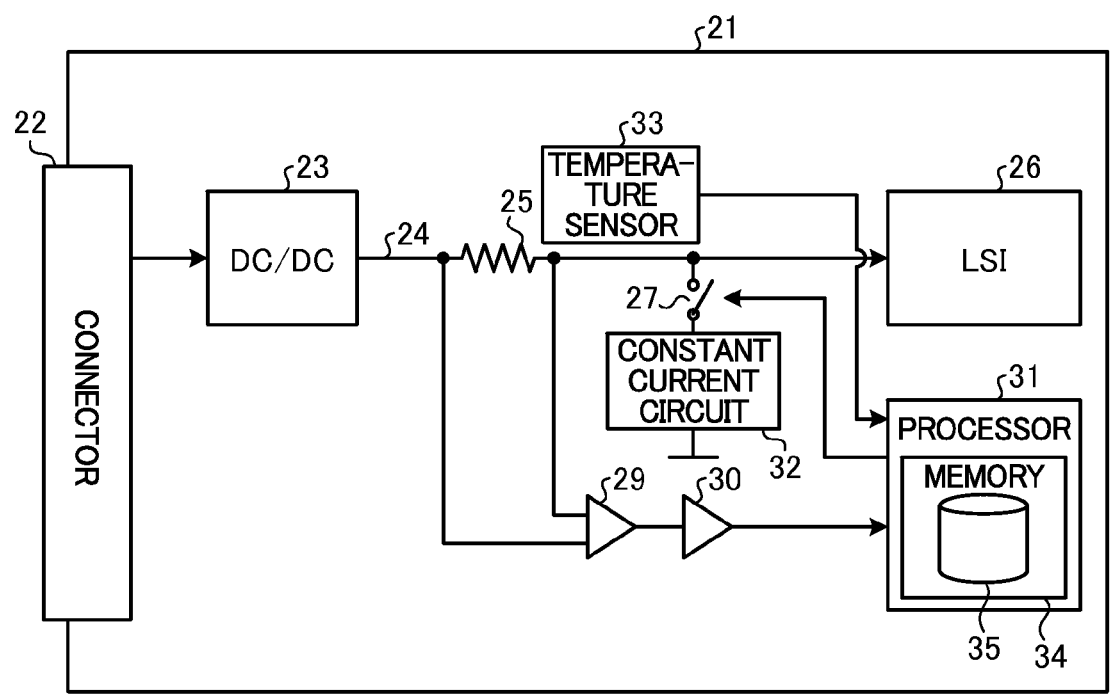
FIG. 12 is a view illustrating a fourth exemplary electronic device.

FIG. 12 is a view illustrating a fourth exemplary electronic device. As illustrated in FIG. 12, the fourth exemplary electronic is similar to the third exemplary electronic device illustrated in FIG. 11 except that the fourth exemplary electronic device further includes a temperature sensor 33 configured to detect the temperature of the wiring portion 25 of the power supply wiring 24 and stores temperature characteristic data 35 in a memory 34.

The temperature sensor 33 is disposed in the vicinity of the wiring portion 25 of the power supply wiring 24 and is connected to the processor 31. The temperature sensor 33 detects the temperature in the vicinity of the wiring portion 25 of the power supply wiring 24, converts the detected value into a digital signal, and delivers the digital signal to the processor 31. The processor 31 treats the temperature in the vicinity of the wiring portion 25 of the power supply wiring 24 which is detected by the temperature sensor 33, as the temperature of the wiring portion 25. A temperature sensor IC may be an example of the temperature sensor 33. Meanwhile, when the temperature sensor 33 outputs the detected temperature value as an analog signal, the analog signal output from the temperature sensor 33 may be converted into a digital signal by the ADC 30 and the digital signal may be input to the processor 31.

The memory 34 may be incorporated in the processor 31. For example, the memory 34 may be the non-volatile memory 13 illustrated in FIG. 3. Alternatively, the memory 34 may be mounted on the printed circuit board 21 separately from the processor 31 such that the processor 31 may access the memory 34. The memory 34 may be an EEPROM or a rewritable ROM such as a flash memory.

FIG. 13 is a view illustrating the first exemplary temperature characteristic data. As illustrated in FIG. 13, the temperature characteristic data 35 includes, for example, fields for "Temperature", fields for "Data Presence/Absence", and fields for "Wiring Resistance Value". In the "Temperature" fields, temperature values of the wiring portion 25, for example, from 0.0° C. to 100.0° C. at an interval of 0.1° C., are stored. In the "Data Presence/Absence" fields, values which represent whether or not data of a wiring resistance value is present are stored for each temperature. For example, in a "Data Presence/Absence" field, when data of a wiring resistance value is absent, "0" may be stored, and when data of a wiring resistance value is present, "1" may be stored. In the "Wiring Resistance Value" fields, wiring resistance values of the wiring portion 25 are stored for each temperature.

As for an example illustrated in FIG. 13, the value in the "Data Presence/Absence" field for the temperature of 0.1° C. represents "Presence" and 1.001 mΩ is stored as the wiring resistance value. For the temperature of 0.2° C., the value in the "Data Presence/Absence" field represents "Absence" and no wiring resistance value is stored. For the temperature of 100.0° C., the value in the "Data Presence/Absence" field represents "Presence" and 2.000 mΩ is stored as the wiring resistance value. For the temperature of 0.0° C., the value in the "Data Presence/Absence" field has been "Absence" until the latest moment and 1.000 mΩ is calculated by the processor 31 as the wiring resistance value. Thus, the "Wiring Resistance Value" field is in the state where 1.000 mΩ is correctly stored therein. Thereafter, the value for the temperature of 0.0° C. in the "Data Presence/Absence" field is rewritten as "Presence" by the processor 31.

The processor detects the temperature of the wiring portion 25 of the power supply wiring 24 through the temperature sensor 33. When data of a wiring resistance value for the detected temperature is present in the temperature characteristic data 35, the processor 31 acquires the wiring resistance value from the temperature characteristic data 35. When no wiring resistance value data for the temperature detected by the temperature sensor 33 is present in the temperature characteristic data 35, the processor 31 calculates the wiring resistance value of the wiring portion 25 in the same manner as, for example, the second exemplary current monitoring method illustrated in FIG. 10, and stores the wiring resistance value in the temperature characteristic data 35.

Since the other configuration is the same as the third exemplary electronic device illustrated in FIG. 11, overlapping descriptions will be omitted. Meanwhile, as in the second exemplary electronic device illustrated in FIG. 5, the pilot resistor 28 may be used instead of the constant current circuit 32.

Third Embodiment of Current Monitoring Method

Figure 14:
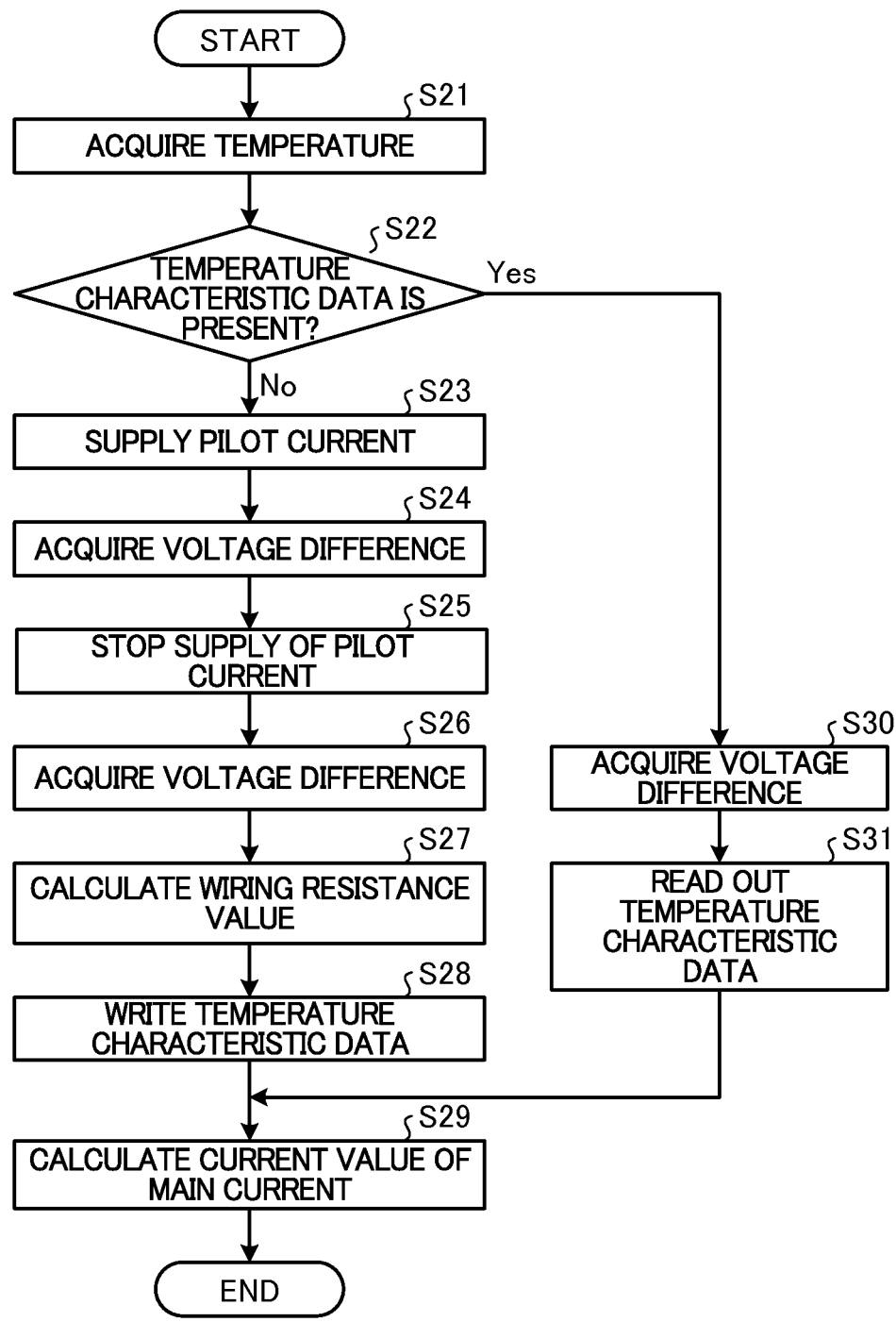
FIG. 14 is a view illustrating a third exemplary current monitoring method.

FIG. 14 illustrates a third exemplary current monitoring method. The current monitoring method illustrated in FIG. 14 is carried out, for example, in the electronic device illustrated in FIG. 12.

As illustrated in FIG. 14, the current monitoring method is initiated, for example, in the electronic device illustrated in FIG. 12, the processor 31 acquires the temperature of the wiring portion 25 of the power supply wiring 24 which is detected by the temperature sensor 33 (operation S21). In addition, with reference to the temperature characteristic data 35, the processor 31 determines whether or not data of the wiring resistance value corresponding to the acquired temperature is present in the temperature characteristic data 35 (operation S22).

When it is determined that the corresponding data is absent in the temperature characteristic data 35 (operation S22: No), the processor 31 controls the supply of the pilot current and stop of the supply of the pilot current in the same manner as operations S11 to S14 described above so as to calculate the wiring resistance value of the wiring portion 25 of the power supply wiring 24 (operations 23 to 27). In addition, the processor 31 writes the calculated wiring resistance value in the "Wiring Resistance Value" field corresponding to the temperature in the temperature characteristic data 35 and at the same time, rewrites the value of the corresponding temperature in the "Data Presence/Absence" as "Presence" (operation S28).

Subsequently, the processor 31 calculates the current value of the main current based on the wiring resistance value calculated at operation S27 and from Equation (6) described above (operation S29). Then, a series of operations in the current monitoring method are terminated.

Meanwhile, when it is determined that the corresponding data is present in the temperature characteristic data 35 at operation S22 (operation S22: Yes), the processor 31 acquires the voltage difference occurring between the both ends of the wiring portion 25 of the power supply wiring 24 from the differential amplifier 29 and the ADC 30 in a state where the processor 31 controls the switch 27 to be turned OFF such that the pilot current does not flow (operation S30). In addition, the processor 31 reads out the wiring resistance value data corresponding to the temperature from the temperature characteristic data 35 (operation S31). Meanwhile, operation S31 may be performed prior to operation S30.

Subsequently, the processor 31 calculates the current value of the main current based on the value of the voltage difference acquired at operation S30 and the data of the wiring resistance value acquired at operation S31 (operation S29). The current value of the main current may be obtained, for example, by dividing value of the voltage difference acquired at operation S30 by the wiring resistance value acquired at operation S31. In addition, a series of operations in the current monitoring method are terminated.

According to the electronic device illustrated in FIG. 12 and the current monitoring method illustrated in FIG. 14, when the wiring resistance value data corresponding to the temperature of the wiring portion 25 of the power supply wiring 24 is present in the temperature characteristic data 35, the data of the wiring resistance value may be acquired from the temperature characteristic data 35. Thus, the current monitoring method is terminated without flowing the pilot current. Accordingly, since the number of times of flowing the pilot current are reduced to suppress the accumulated current value of the pilot current, the increase of power consumption may be suppressed.

Fifth Embodiment of Electronic Device

FIG. 15 is a view illustrating a second exemplary temperature characteristic data. As illustrated in FIG. 15, the second exemplary temperature characteristic data includes fields for "Tolerable Resistance Value Range", in addition to, for example, the "Temperature" fields and "Data Presence/Absence" fields in the first example of the temperature characteristic data illustrated in FIG. 13 and also includes fields for "Statistical Result of Wiring Resistance Value" instead of the "Wiring Resistance Value" fields.

In the "Tolerable Resistance Value Range" fields, values of the tolerable range of the wiring resistance values of the wiring portion 25 of the power supply wiring 24 are stored for each temperature. The values of the tolerable range of the wiring resistance values may be set in advance by the designer of the electronic device. In the "Statistical Result of Wiring Resistance Value" fields, for example, values which are statistically processed with a previously calculated wiring resistance values are stored whenever the processor 31 calculates the wiring resistance values of the wiring portion 25. For example, an average between the newly calculated wiring resistance value and previously calculated wiring resistance value may be taken and used as a statistical result of the wiring resistance value.

As an example, in the example illustrated in FIG. 15, for each of the temperatures of, for example, 0.0° C., 0.1° C. and 0.2° C., 1.0 mΩ±10% is stored as a tolerable range of the resistance value. For the temperature of 100° C., 2.0 mΩ±10% is stored as the tolerable range of the resistance value. For the temperature of 0.0° C., the value in the "Data Presence/Absence" field has been "Absence" until the latest moment but 1.000 mΩ is calculated by the processor 31 as the wiring resistance value. Thus, the "Wiring Resistance Value" field is in the state where 1.000 mΩ is correctly stored therein. Thereafter, the value for the temperature of 0.0° C. in the "Data Presence/Absence" field is rewritten as "Presence" by the processor 31.

The processor 31 detects the temperature of the wiring portion 25 of the power supply wiring 24 through the temperature sensor 33 and calculates a wiring resistance value. When the calculated wiring resistance value is included within the tolerable range of the resistance value for the detected temperature, the processor 31 acquires a statistic wiring resistance value and updates the value for the corresponding temperature in the "Statistical Result of Wiring Resistance Value" field in the temperature characteristic data 35.

In some cases, the calculated wiring resistance value is included in the tolerable resistance value range but the value is not stored in the "Statistical Result of Wiring Resistance Value" field for the corresponding temperature. In such a case, the processor 31 writes the calculated wiring resistance value in the "Statistical Result of Wiring Resistance Value" field for the corresponding temperature.

Meanwhile, when the calculated wiring resistance value is not included in the tolerable resistance value range for the detected temperature, the processor 31 controls the supply of the pilot current and stop supplying the pilot current again so as to calculate the wiring resistance value. When the calculated wiring resistance value is not included in the tolerable range of the resistance value even though the calculation of the wiring resistance value is repeated a predetermined number of times, the processor 31 may issue a warning to stop the operation. The electronic device that has issued the warning may be treated as a defective product. For example, the influence of noise may be one of the reasons that cause the calculated wiring resistance value does not fall within the tolerable resistance value range.

Meanwhile, as in the second exemplary electronic device illustrated in FIG. 5, the pilot resistor 28 may be used instead of the constant current circuit 32.

Fourth Embodiment of Current Monitoring Method

Figure 16:
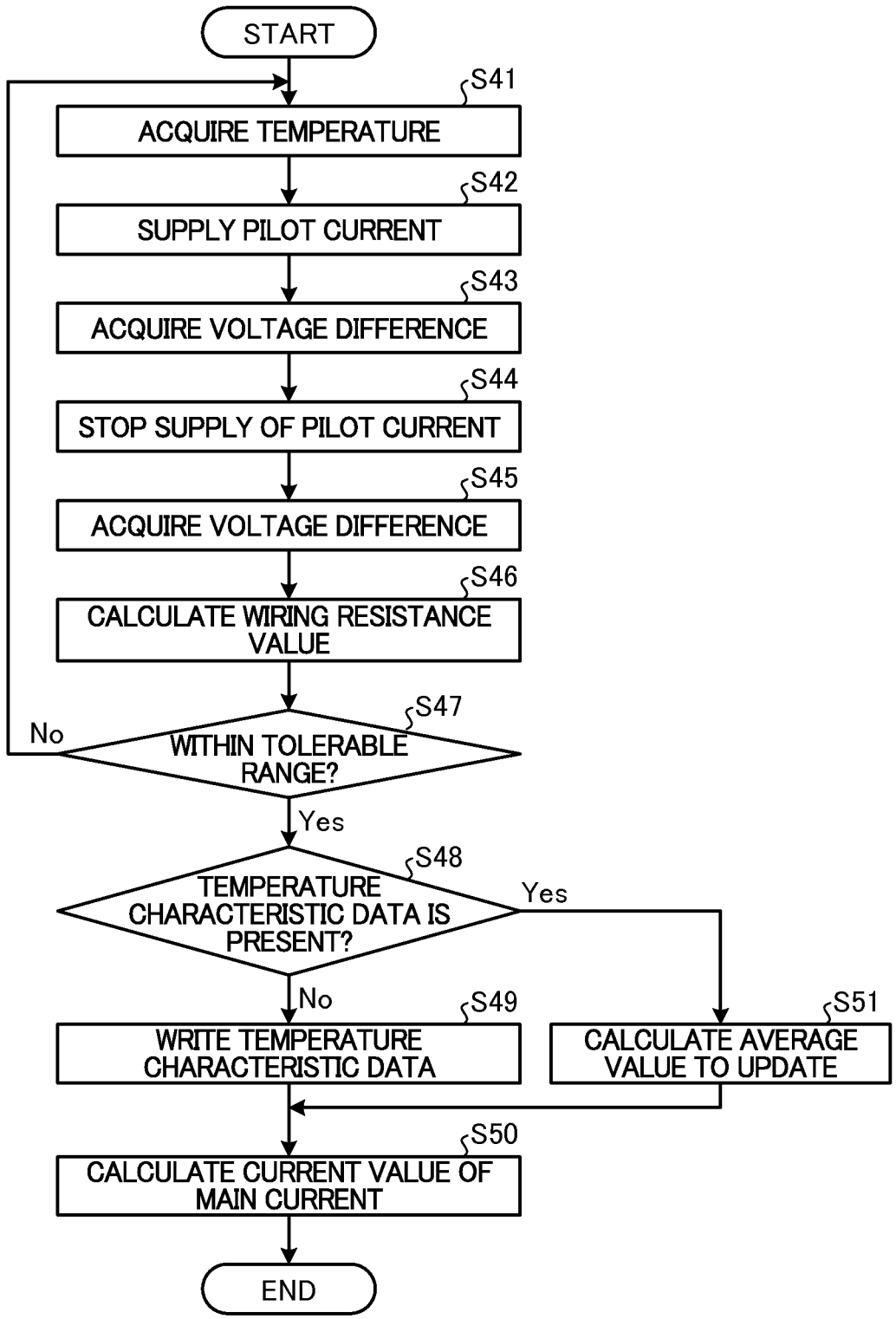
FIG. 16 is a view illustrating a fourth exemplary current monitoring method.

FIG. 16 is a view illustrating a fourth exemplary current monitoring method. The current monitoring method illustrated in FIG. 16 is carried out in an electronic device having, for example, the temperature characteristic data 35 illustrated in FIG. 15.

As illustrated in FIG. 16, when the current monitoring method is initiated in the electronic device including, for example, the temperature characteristic data 35, the processor 31 acquires the temperature of the wiring portion 25 of the power supply wiring 24 which is detected by the temperature sensor 33 (operation S41). Subsequently, in the same manner as operations S11 to S15 described above, the processor 31 controls the supply of the pilot current and stop of the supply of the pilot current so as to calculate the wiring resistance value of the wiring portion 25 of the power supply wiring 24 (operations S42 to S46).

Subsequently, the processor 31 refers to the temperature characteristic data 35, and determines whether the wiring resistance value calculated at operation S46 is included in the tolerable resistance value range for the temperature acquired at operation S41 (operation S47). When it is determined that the wiring resistance value is not included in the tolerable range (operation S47: No), the processor 31 returns to operation S41 and repeats operations S41 to S47. Since the wiring resistance value calculated at operation S46 is not included in the tolerable range, when the number of times of repeating operations S41 to S47 reaches a predetermined number of times, the processor 31 may issue a warning and stop the operation.

Meanwhile, when it is determined that the wiring resistance value calculated at operation S46 is included in the tolerable resistance value range for the corresponding temperature (operation S47: Yes), the processor refers to the temperature characteristic data 35, and determines whether data of the statistical result of the wiring resistance value corresponding to the temperature acquired at operation S41 is present in the temperature characteristic data 35 (operation S48).

When it is determined that the corresponding data is absent in the temperature characteristic data 35 (operation S48: No), the processor 31 writes the wiring resistance value calculated at operation S46 in the "Statistical Result of Wiring Resistance" field for the corresponding temperature in the temperature characteristic data 35. In addition, the processor 31 rewrites the value in the "Data Presence/Absence" field for the corresponding temperature in the temperature characteristic data 35 as "Presence" (operation S49).

Subsequently, the processor 31 calculates the current value of the main current based on the wiring resistance value calculated at operation S46 and from Equation (6) described above (operation S50). Then, a series of the operations in the current monitoring method are terminated.

Meanwhile, when it is determined that the corresponding data is present in the temperature characteristic data 35 at operation S48 (operation S48: Yes), the processor 31 calculates a statistical value of the value in the "Statistical Result of Wiring Resistance Value" field corresponding to the temperature acquired in operation S41 and the wiring resistance value calculated at operation S46, for example, an average value. In addition, the processor 31 stores the calculated statistical value, for example, the average value, in the "Statistical Result of Wiring Resistance Value" field corresponding thereto so as to update the value of the "Statistical Result of Wiring Resistance Value" field (operation S51).

Subsequently, the processor 31 determines the value of the statistical result calculated at operation S51 as the wiring resistance value of the wiring portion 25 of the power supply wiring 24, and calculates the current value of the main current based on the wiring resistance value and from Equation (6) described above (operation S50). In addition, a series of operations in the current monitoring method are terminated.

According to the electronic device having the temperature characteristic data 35 illustrated in FIG. 15 and the current monitoring method illustrated in FIG. 16, when a calculated wiring resistance value is out of the tolerable range, the supply of the pilot current and stop of the supply of the pilot current are controlled to calculate the wiring resistance value again. Therefore, the influence of noise with respect to the wiring resistance value may be reduced. Accordingly, the electronic device may measure the current value of the main current with higher accuracy. In addition, since the current value of the main current may be calculated using the statistical result of the wiring resistance value, the current value of the main current may be measured with higher accuracy.

Sixth Embodiment of Electronic Device

FIG. 17 is a third exemplary temperature characteristic data. As illustrated in FIG. 17, the sixth exemplary electronic device is a case in which temperature characteristic data 35 includes fields for "Pilot Current Absence Temperature" and fields for "Pilot Current Presence Temperature", instead of, for example, the "Temperature" fields in the fourth exemplary electronic device illustrated in FIG. 12. In addition, the temperature characteristic data 35 includes fields for "Δ° C. Correction Amount" and fields for "ΔmΩ Correction Amount", and fields for "Tolerable Resistance Value Range" in addition to the "Data Presence/Absence" fields and further includes fields for "Statistical Result of Wiring Resistance Value", instead of the "Wiring Resistance Value" fields.

In the "Pilot Current Absence Temperature" fields, the temperature values of the wiring portion 25 where the pilot current does not flow are stored, for example, from 0.0° C. to 100.0° C. at an interval of 0.1° C. In the "Pilot Current Presence Temperature" fields, the temperature values of the wiring portion 25 where the pilot current flows are stored.

In the "Δ° C. Correction Amount" fields, the temperature difference values of the wiring portion 25 between the case where the pilot current flows and the case where the pilot current does not flow are stored. In the "ΔmΩ Correction Amount" fields, correction amount values of wiring resistance values, which correspond to the temperature differences of the wiring portion 25 between the case where the pilot current flows and the case where the pilot current does not flow, are stored. The correction amount values of the wiring resistance values, which correspond to the temperature differences of the wiring portion 25 between the case where the pilot current flows and the case where the pilot current does not flow, may be set in advance by a designer of the electronic device.

The designer of the electronic device may perform a test using, for example, the electronic device illustrated in FIG. 12. For example, with respect to each temperature of the wiring portion 25 of the power supply wiring 24, the designer causes the pilot current to flow in addition to the main current and measures how many degrees the temperature rises, and measures an increment of the wiring resistance value of the wiring portion 25 for the temperature rise amount. In addition, the designer may store respective measured values in the "Δ° C. Correction Amount" fields and the "ΔmΩ Correction Amount" fields of the temperature characteristic data 35.

In relation to the "Tolerable Resistance Value Range" fields and the "Statistical Result of Wiring Resistance Value" fields, similar descriptions made with respect to the second exemplary temperature characteristic data illustrated in FIG. 15 may be applied. Accordingly, overlapping descriptions thereof will be omitted.

As an example, in the exemplary temperature characteristic data illustrated in FIG. 17, for example, with respect to the cases where the temperatures are 0.0° C. to 0.2° C., 30.0° C. to 30.2° C., and 100.0° C. when the pilot current does not flow, the temperatures when the pilot current flows are set to be higher by 0.1° C., respectively. Accordingly, with respect to each temperature where the pilot current does not flow, 0.1° C. is stored as a Δ° C. correction amount. Further, with respect to each temperature when the pilot current does not flow, 0.001 mΩ is stored as a ΔmΩ correction amount with respect to a Δ° C. correction amount of 0.1° C. With respect to the temperature of 30.0° C., the value of the corresponding "Data Presence/Absence" field has been "Absence" until the latest moment but 1.300 mΩ is calculated as the wiring resistance value by the processor 31 and thus, the "Statistical Result of Wiring Resistance Value" field is in a state where 1.300 mΩ is correctly stored therein. Thereafter, the value in the "Data Presence/Absence" field for the temperature of 30.0° C. is rewritten as "Presence" by the processor 31.

The processor 31 senses the temperature of the wiring portion 25 of the power supply wiring 25 through the temperature sensor 33 either in a case where the pilot current does not flow, that is, only the main current flows or in a case where the pilot current flows, that is, the main current and the pilot current flow. The processor 31 measures the temperature difference between the case where the pilot current does not flow and the case where the pilot current flows, and acquires a correction amount of the wiring resistance value corresponding the temperature difference from the temperature characteristic data 35 to correct the calculated wiring resistance value.

Since other configurations are the same as the fourth exemplary electronic device illustrated in FIG. 12, overlapping descriptions will be omitted. Meanwhile, as in the second exemplary electronic device illustrated in FIG. 5, the pilot resistor 28 may be used as the constant current circuit 32.

Fifth Embodiment of Current Monitoring Method

Figure 18:
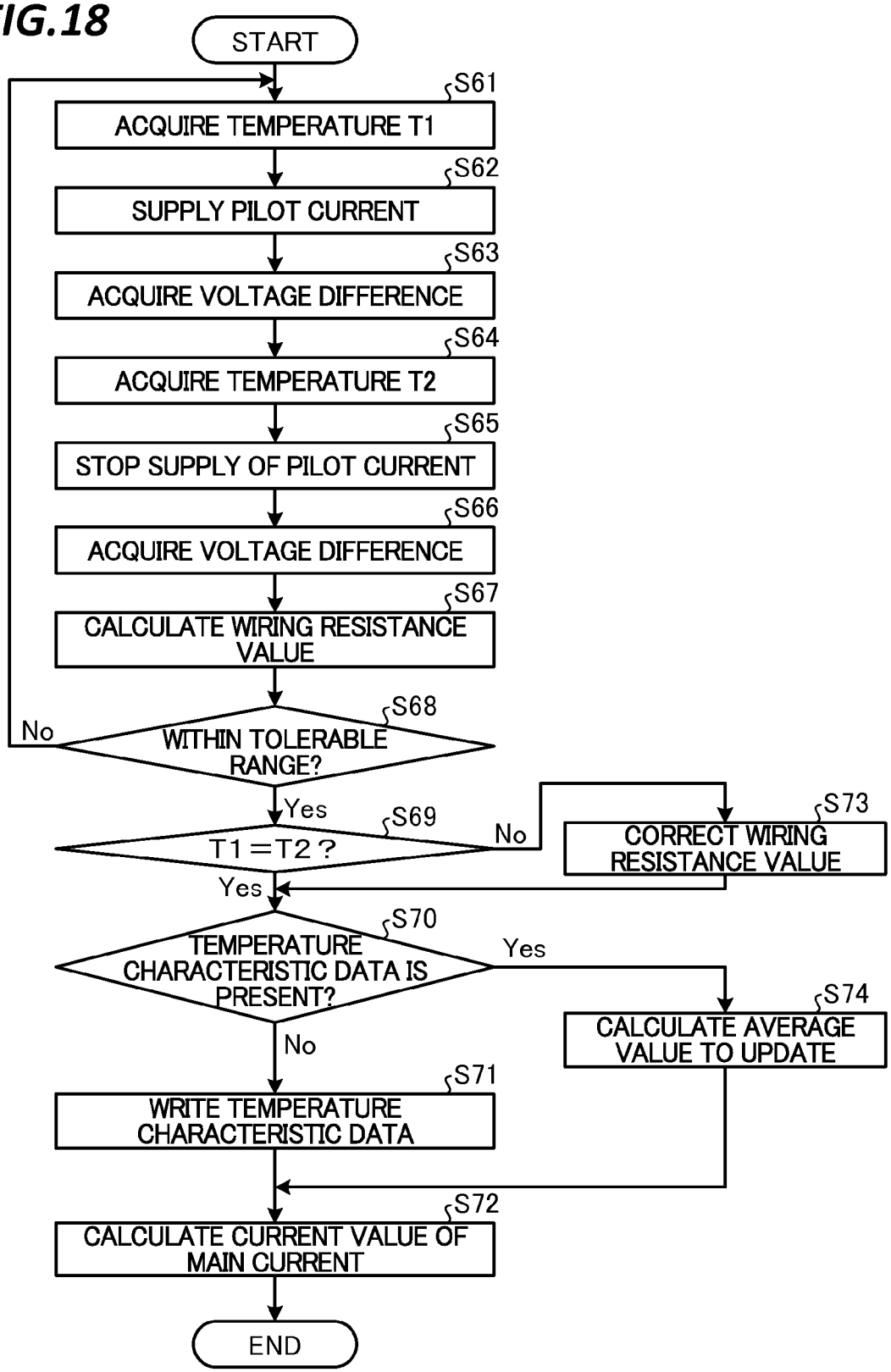
FIG. 18 is a view illustrating a fifth exemplary current monitoring method.

FIG. 18 is a view illustrating a fifth exemplary current monitoring method. The current monitoring method illustrated in FIG. 18 is carried out in an electronic device having, for example, the temperature characteristic data 35 illustrated in FIG. 17.

As illustrated in FIG. 18, when the current monitoring method is initiated in the electronic device having, for example, the temperature characteristic data 35 illustrated in FIG. 17, the processor 31 detects and acquires the temperature T1 of the wiring portion 25 of the power supply wiring 24 through the temperature sensor 33 (operation S61). The temperature T1 is the temperature when the pilot current does not flow. Subsequently, in the same manner as operations S11 and S12 described above, the processor 31 supplies the pilot current such that the pilot current flows (operation S62), and acquires the voltage difference between the both ends of the wiring portion 25 (operation S63).

Subsequently, the processor 31 detects and acquires the temperature T2 of the wiring portion 25 through the temperature sensor 33 (operation S64). The temperature T2 is a temperature when the pilot current flows. Subsequently, in the same manner as operations S13 and S14 described above, the processor 31 stops supplying the pilot current such that the pilot current does not flow (operation S65), and acquires the voltage difference between the both ends of the wiring portion 25 (operation S66). In addition, in the same manner as operation S15, the processor calculates the wiring resistance value of the wiring portion 25 of the power supply wiring 24 (operation S67).

Subsequently, with reference to the temperature characteristic data 35, the processor 31 determines whether the wiring resistance value calculated in operation S67 is included in the tolerable resistance value range for the temperature T1 acquired at operation S61 (operation S68). When it is determined that the wiring resistance value is not included in the tolerable range (operation S68: No), the processor 31 returns to operation S61 and repeats operations S61 to S68. Since the wiring resistance value calculated at operation S67 is not included in the tolerable range, when the number of times of repeating operations S61 to S68 reaches a predetermined number of times, the processor 31 may issue a warning to stop the operation.

Meanwhile, when it is determined that the wiring resistance value calculated at operation S67 is included in the tolerable resistance value range for the corresponding temperature (operation S68: Yes), the processor 31 determines whether the temperature T1 acquired at operation S61 and the temperature T2 acquired at operation S64 coincide with each other (operation S69). When it is determined that the temperatures T1 and T2 coincide with each other (operation S69: Yes), the process proceeds to operation S70. When it is determined that the temperatures T1 and T2 do not coincide with each other (operation S69: No), the processor 31 refers to the temperature characteristic data 35, and acquires the correction amount of the wiring resistance value corresponding to the temperature T1 acquired at operation S61 from the temperature characteristic data 35. The processor 31 corrects the wiring resistance value calculated at operation S67 using the correction amount of the wiring resistance value (operation S73). Then, the processor 31 proceeds to operation S70.

At operation S70, in the same manner as operation S48 described above, the processor 31 determines whether data of the statistical result of the wiring resistance value corresponding to the temperature acquired at operation S61 is present in the temperature characteristic data 35 (operation S70). When it is determined that the corresponding data is absent in the temperature characteristic data 35 (operation S70: No), in the same manner as operation S49 described above, the wiring resistance value calculated in operation S67 or the wiring resistance value corrected in operation S73 is written in the "Statistical Result of Wiring Resistance Value" field in the temperature characteristic data 35. In addition, the processor 31 rewrites the corresponding value of the "Data Presence/Absence" field as "Presence" (operation S71).

When it is determined that the corresponding data is present in the temperature characteristic data 35 (operation S70: Yes), in the same manner as operation S51 described above, for example, an average value of the wiring resistance values is calculated and the values of the "Statistical Result of Wiring Resistance Value" field in the temperature characteristic data 35 is updated using the average value (operation S74).

Following operations S71 or operation S74, the processor 31 calculates the current value of the main current based on the value written in the "Statistical Result of Writing Resistance Field" of the temperature characteristic data 35 at operation S71 or the value updated in the "Statistical Result of Writing Resistance Value" field at operation S74 and from the Equation (6) described above (operation S72). Then, a series of operations in the current monitoring method are terminated.

As an example, it is assumed that, for example, when the pilot current does not flow, the temperature of the wiring portion 25 of the power supply wiring 24 is 30.0° C. and the voltage difference between the opposite ends of the wiring portion 25 is 0.1 V. In addition, it is assumed that, for example, when the pilot current flows, the temperature of the wiring portion 25 of the power supply wiring 24 is 30.1° C. and the voltage difference between the opposite ends of the wiring portion 25 is 0.101301 V. Further, it is assumed that the current value of the pilot current is 1 A. In such a case, the wiring resistance value of the wiring portion 25 will be 1.301 mΩ from Equation (5) described above. However, according to, for example, the temperature characteristic data 35 illustrated in FIG. 17, the increment of the wiring resistance value when the temperature of the wiring portion 25 rises by 0.1° C. from 30.0° C. to 30.1° C. as the pilot current flows is 0.001 mΩ. Thus, when the increment of the wiring resistance value is corrected, the practical wiring resistance value of the wiring portion 25 will be 1.300 mΩ.

Figure 19:
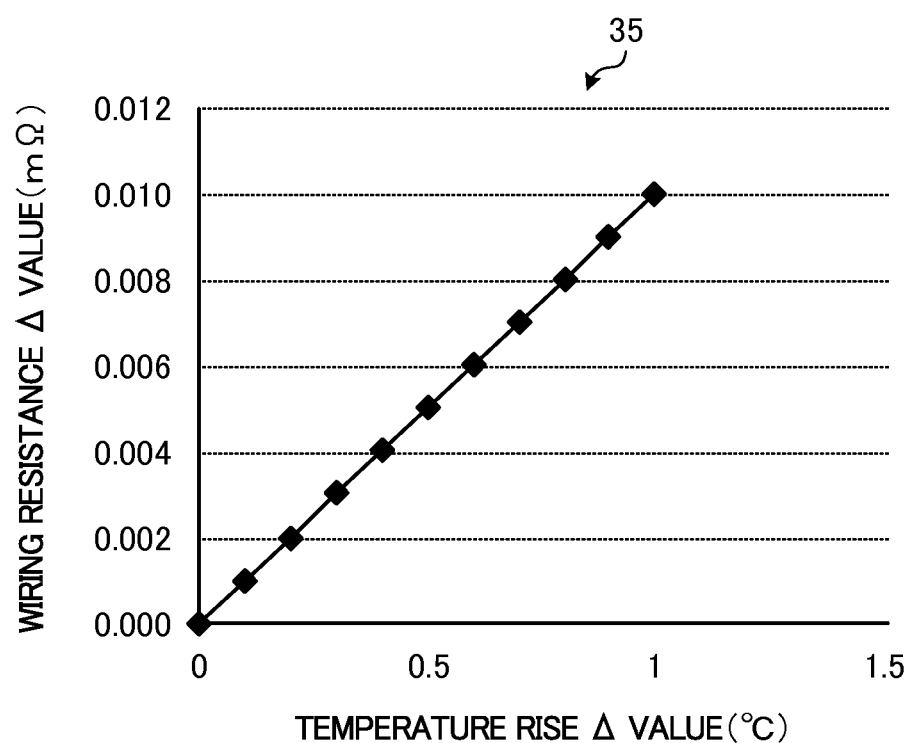
FIG. 19 is a view illustrating fourth exemplary temperature characteristic data.

FIG. 19 is a fourth exemplary temperature characteristic data. The example illustrated in FIG. 19 represents the increments of the wiring resistance value in a temperature range from 25° C. to 26° C. which were obtained by measuring the wiring resistance value of the wiring portion 25 of the power supply wiring 24 at an interval of 0.1° C.

As illustrated in FIG. 19, the increment of the wiring resistance value in the case where the temperature of the wiring portion 25 of the power supply wiring 24 rises may be measured in advance and then the relationship between a temperature rise amount and the increment of the wiring resistance value may be maintained in the electronic device as the temperature characteristic data 35. For example, since a current starts to flow in the wiring portion 25 of the power supply wiring 24 at the time of setup when activating the electronic device, the temperature of the wiring portion 25 of the power supply wiring 24 rises. The temperature characteristic data as illustrated in FIG. 19 may be acquired by measuring the wiring resistance value of the wiring portion 25 of the power supply wiring 24 at a constant temperature interval, for example, at an interval of 0.1° C. from 0.0° C. to 100.0° C. while the temperature rises at the time of setup. For example, when the increment of the wiring resistance value is varied, for example, while the temperature rises by 0.1° C., an approximate value may be used.

According to an electronic device having the temperature characteristic data 35 illustrated in FIG. 17 or FIG. 19 and the current monitoring method illustrated in FIG. 18, when the temperature of the wiring portion 25 rises as the pilot current flows in the wiring portion 25 of the power supply wiring 24, the variation of the wiring resistance value of the wiring portion 25 caused by the rise of the temperature may be corrected. Accordingly, since the electronic device may eliminate the influence of the heat generated by the flow of the pilot current, the current value of the main current may be measured with higher accuracy. Alternatively, various values may be set as temperature rise amounts of the wiring portion 25 and the increment of the wiring resistance value of the wiring portion 25 for each of the set values of the temperature rise amounts may be set. Then, not only the influence of the heat generated by the flow of the pilot current but also the variation of the wiring resistance value caused by the change of temperature of the environment where the electronic device is placed may be corrected. In addition, when the temperature characteristic data 35 illustrated in FIG. 19 is used, a relationship of the correction amount of the wiring resistance value with respect to the temperature rise amount of the wiring portion 25 may be obtained at the time of activating the electronic device. Thus, the designer of the electronic device may not need to obtain this relationship in advance through a test. Accordingly, the temperature characteristic data 35 may be readily acquired.

Seventh Embodiment of Electronic Device

Figure 20:
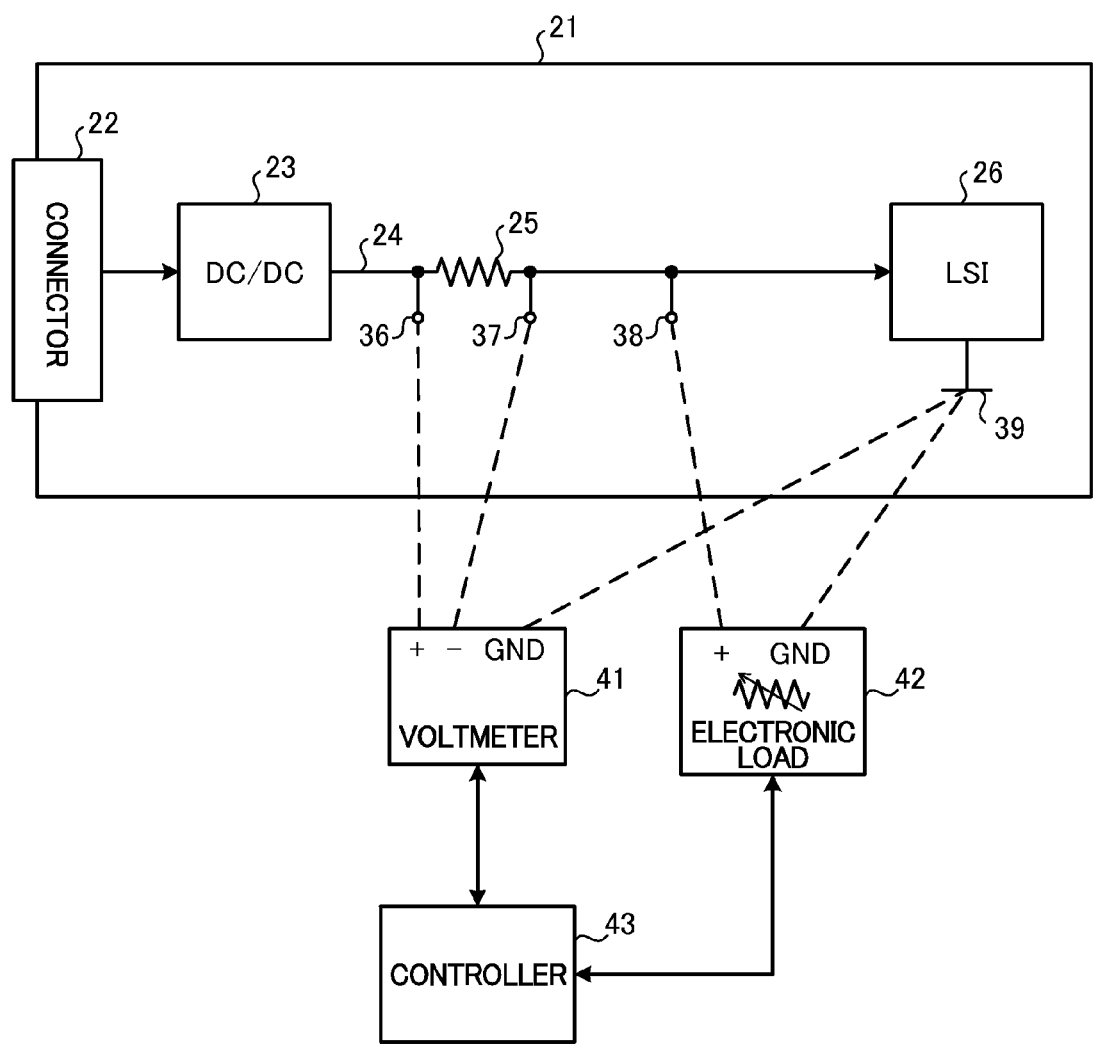
FIG. 20 is a view illustrating a seventh exemplary electronic device.

FIG. 20 is a view illustrating a seventh exemplary electronic device. As illustrated in FIG. 20, the seventh exemplary electronic device has similar configuration to the second exemplary electronic device illustrated in FIG. 5 or the third exemplary electronic device illustrated in FIG. 11 except that the seventh exemplary electronic device does not include the switch 27 and the pilot resistor 28 or does not include the constant current circuit 32, the differential amplifier 29, the ADC 30, and the processor 31.

The functions implemented by the switch 27 and the pilot resistor 28 or the functions implemented by the constant current circuit 32, the differential amplifier 29, the ADC 30, and the processor 31 are implemented by external devices 41 to 43 with respect to the electronic device. For example, a volt member 41, an electronic load 42, and a controller 43 may be used as the external devices.

In the printed circuit board 21, for example, four measurement points are set. For example, the first measurement point 36 is provided between the DC/DC converter 23 and the wiring portion 25 in the power supply wiring 24. The second measurement point 37 may be provided between the wiring portion 25 and the LSI 26 in the power supply wiring 24. The third measurement point 38 may be provided between the second measurement point 37 and the LSI 26 in the power supply wiring 24. The fourth measurement point 39 may be provided in a ground wiring of the printed circuit board 21 or a ground terminal of the LSI 26.

The voltmeter 41 implements the functions of the differential amplifier 29 and the ADC 30. In the voltmeter 41, the plus (+) terminal is connected to the first measurement point 36, the minus (−) terminal is connected to the second measurement point 37, and the GND terminal is connected to the fourth measurement point 39. As an example of the voltmeter 41, DIGITAL MULTIMETER R6451A available from ADVANTEST Corp. may be exemplified.

The electronic load 42 implements the functions of the switch 27 and the pilot resistor 28 or the function of the constant current circuit 32. In the electronic load 42, the plus (+) terminal is connected to the third measurement point 38 and the GND terminal is connected to the fourth measurement point 39. As an example of the electronic load 42, ELECTRONIC LOAD EUL-300aB available from FUJITSU DENSO Corp. may be exemplified.

The controller 43 implements the functions of the processor 31. The controller 43 is connected to the voltmeter 41 and the electronic load 42. The controller 43 controls the voltmeter 41 and the electronic load 42 so as to carry out a sixth or seventh exemplary current monitoring method to be described later, thereby collecting data. In addition, the controller 43 calculates the current value of the main current flowing into the LSI 26 by processing the collected data. For example, a personal computer on the market may be used as the controller 43.

Sixth Embodiment of Current Monitoring Method

Figure 21:
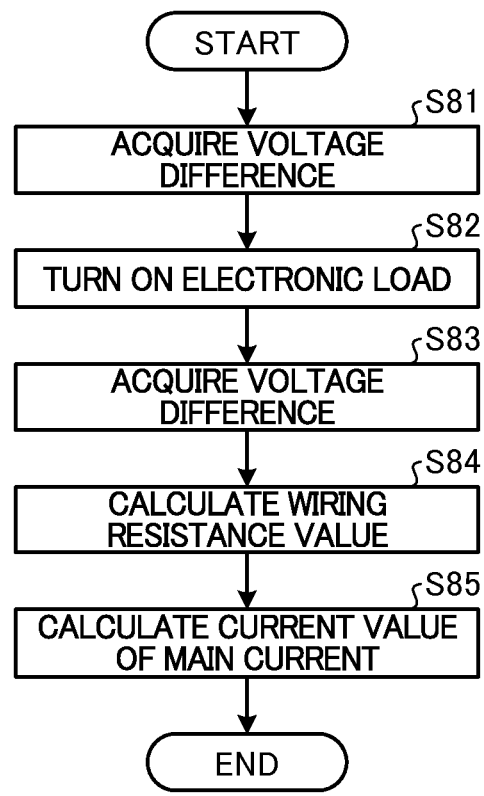
FIG. 21 is a view illustrating a sixth exemplary current monitoring method.

FIG. 21 is a view illustrating a sixth exemplary current monitoring method. The current monitoring method illustrated in FIG. 21 may be carried out in a current measurement system including, for example, the electronic device illustrated in FIG. 20.

As illustrated in FIG. 21, when the current monitoring method is initiated in the current measurement system including the electronic device illustrated in FIG. 20, the controller 43 controls the electronic load 42 to be in an OFF state. Then, the controller 43 reads the voltmeter 41 so as to acquire a voltage difference occurring between the opposite ends of the wiring portion 25 when the main current flows in the wiring portion 25 of the power supply wiring 24 (operation S81).

Subsequently, the controller 43 sets the current value of the electronic load 42 to, 1 A, for example, and controls the electronic load 42 be in an ON state (operation S82). As a result, the main current and the pilot current of, for example, 1A, flow in the wiring portion 25 of the power supply wiring 24. Further, the controller 43 reads the voltmeter 41 so as to acquire a voltage difference occurring between the opposite ends of the wiring portion 25 when the main current and the pilot current flow in the wiring portion 25 of the power supply wiring 24 (operation S83).

Subsequently, the controller 43 calculates the wiring resistance value of the wiring portion 25 of the power supply wiring 24 from Equation (5) described above (operation S84). Subsequently, the controller 43 calculates the current value of the main current based on the wiring resistance value calculated at operation S84 and from Equation (6) described above (operation S85). In addition, the controller 43 terminates a series of operations in the current monitoring method. Meanwhile, the voltage difference occurring between the opposite ends of the wiring portion 25 may be acquired by turning ON the electronic load 42 to acquire the voltage difference occurring between the opposite ends of the wiring portion 25 and then turning OFF the electronic load 42.

Seventh Embodiment of Current Monitoring Method

Figure 22:
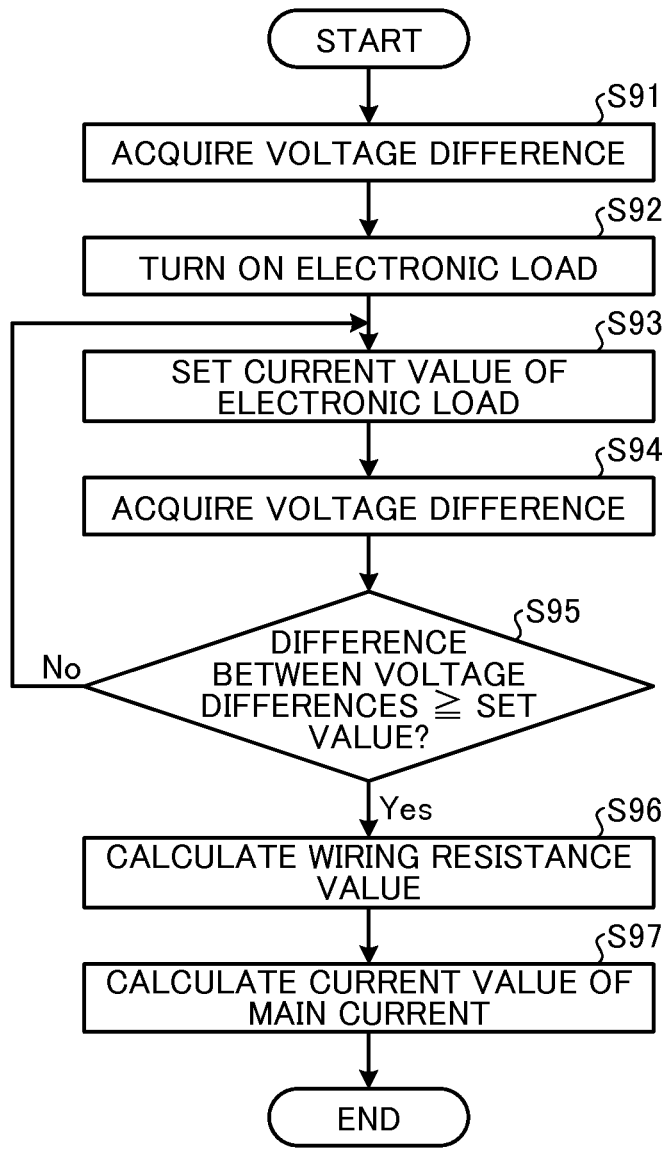
FIG. 22 is a view illustrating a seventh exemplary current monitoring method.

FIG. 22 is a view illustrating a seventh exemplary current monitoring method. The current monitoring method illustrated in FIG. 22 is carried out in a current measurement system including, for example, the electronic device illustrated in FIG. 20.

As illustrated in FIG. 22, when the current monitoring method is initiated in a current system including, for example, the electronic device illustrated in FIG. 20, the controller 43 controls the electronic load 42 to be in the OFF state. Then, the controller 43 reads the voltmeter 41 so as to acquire voltage difference occurring between the opposite ends of wiring portion 25 when the main current flows in the wiring portion 25 of the power supply wiring 24 (operation S91).

Subsequently, the controller 43 sets the current value of the electronic load 42 to, for example, 0 A, and controls the electronic load 42 to be in the ON state (operation S92). Subsequently, the controller 43 sets the current value of the electronic load 42 to a value obtained by increasing the present set value, for example, by 0.01 A (operation S93). As a result, the main current and the pilot current having the current value set at the operation S93 flow in the wiring portion 25 of the power supply wiring 24. The value to be added to the present current value of the electronic load 42 is not limited to 0.01 A and may be, for example, 0.02 A or 0.1 A.

In addition, the controller 43 reads the voltmeter 41 to acquire the voltage difference occurring between the opposite ends of the wiring portion 25 as the main current and the pilot current flow in the wiring portion 25 of the power supply wiring 24 (operation S94). Subsequently, the controller 43 subtracts the value of the voltage difference acquired in operation S91 from the value of the voltage difference acquired in operation S94 to acquire a difference between the voltage differences, and determines whether or not the calculated difference is equal to or more than a set value (operation S95). The set value as a standard for determination may be, for example, 0.1 V, although it is not particularly limited.

When it is determined that the difference between the voltage differences is not equal to nor more than the set value (operation S95: No), the controller 43 returns to operation S93 and repeats operations S93 to S95. When it is determined that the difference between the voltage differences is equal to or more than the set value (operation S95: Yes), the controller 43 calculates the wiring resistance value of the wiring portion 25 of the power supply wiring 24 from Equation (5) described above (operation S96). Subsequently, the controller 43 calculates the current value of the main current based on the wiring resistance value calculated in operation S96 and from Equation (6) described above (operation S97). Then, a series of operations in the current monitoring method are terminated.

According to the current measurement system including the electronic device illustrated in FIG. 20 and the current monitoring method illustrated in FIG. 21 or FIG. 22, the current value of the main current may be measured even if the electronic device does not include the switch 27 and the pilot resistor 28, or the constant current circuit 32, the differential amplifier 29, the ADC 30, and the processor 31. In addition, according to the current monitoring method illustrated in FIG. 22, since the current value of the pilot current is automatically set, it is not necessary to confirm in advance the current setting of each portion according to the power supply wiring of the electronic device. Accordingly, even if the circuit specification of the electronic device is not obvious, the current value of the main current may be measured.

Eighth Embodiment of Electronic Device

Figure 23:
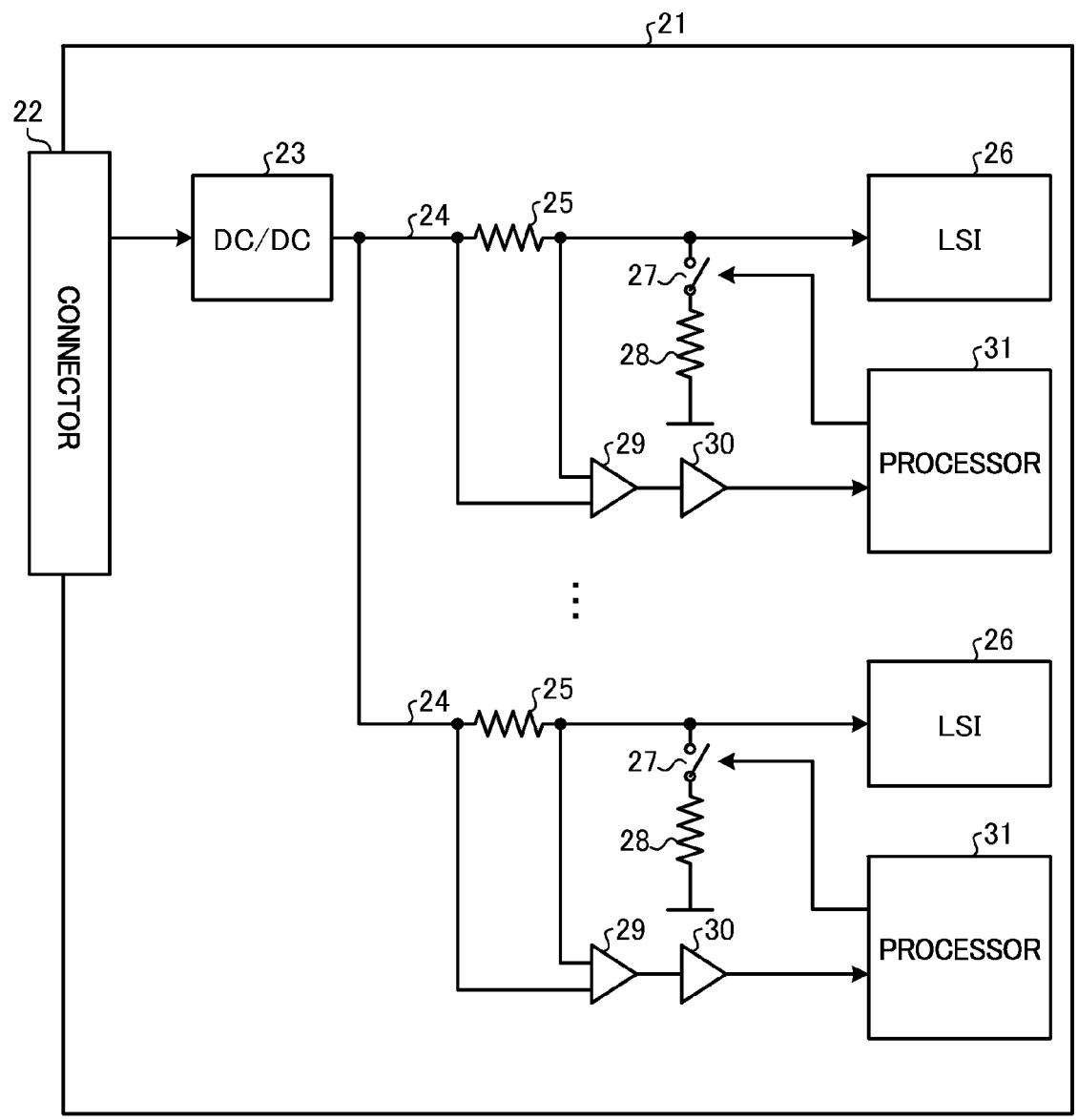
FIG. 23 is a view illustrating an eighth exemplary electronic device.

FIG. 23 is a view illustrating an eighth exemplary electronic device. As illustrated in FIG. 8, the eighth exemplary electronic device is configured such that, in the second exemplary electronic device illustrated in FIG. 5, a plurality of LSIs 26 are connected to the DC/DC converter 23 through the power supply wiring 24. In such a case, each of the LSIs 26 is provided with a switch 27, a pilot resistor 28, a differential amplifier 29, an ADC 30, and a processor 31.

It is desirable that the power supply wiring 24 extending from each LSI 26 is branched at a portion which is located as close to the DC/DC converter 23 as possible. Then, since the substantially entire power supply wiring 24 between the DC/DC converter 23 and each LSI 26 becomes the wiring portion 25, the wiring resistance value of the wiring portion 25 for each LSI 26 becomes large enough for measuring the main current.

Since others configurations are the same as the second exemplary electronic device illustrated in FIG. 5, overlapping descriptions thereof will be omitted. Meanwhile, as in the third exemplary electronic device illustrated in FIG. 11, the constant current circuit 32 may be used instead of the pilot resistor 28. In addition, as in the fourth exemplary electronic device illustrated in FIG. 12, the fourth exemplary electronic device, the fifth exemplary electronic device, or the sixth exemplary electronic device, the temperature sensor 33 may be provided and the temperature characteristic data 35 may be stored in the memory 34.

According to the electronic device illustrated in FIG. 23, even if the electronic device includes a plurality of LSIs 26, the electronic device may measure the current value of the main current for each of the LSIs 26.

Ninth Embodiment of Electronic Device

Figure 24:
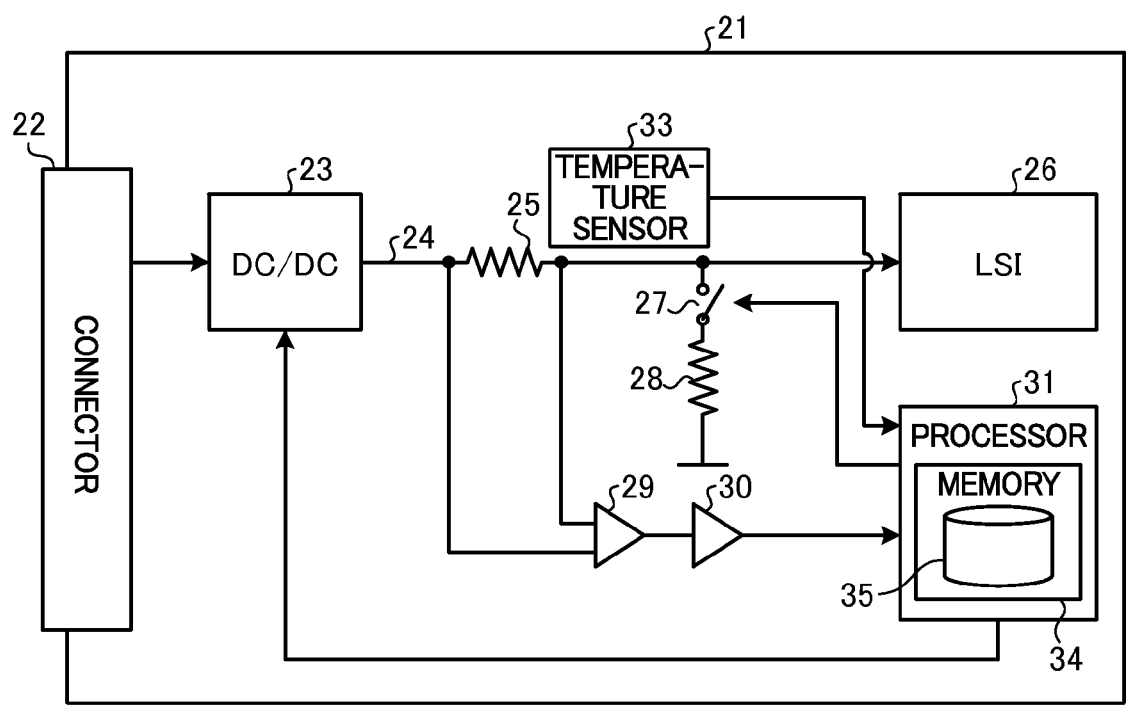
FIG. 24 is a view illustrating a ninth exemplary electronic device.

FIG. 24 is a view illustrating a ninth exemplary electronic device. As illustrated in FIG. 24, the ninth exemplary electronic device controls the shut-down of the DC/DC converter 23 based on the current value of the main current in the fourth exemplary electronic device illustrated in FIG. 12. In addition, the ninth exemplary electronic device includes a pilot resistor 28 instead of the constant current circuit 32.

When the calculated current value of the main current exceeds a pre-set threshold, the processor 31 outputs a control signal of shutting down the DC/DC converter 23 to the DC/DC converter 23. Upon receiving the shut-down control signal from the processor 31, the DC/DC converter 23 is switched to the OFF state. The memory may store a threshold that serves as a standard for determining whether to shut down the DC/DC converter 23.

Since other configurations are the same as the fourth exemplary electronic device illustrated in FIG. 12, overlapping descriptions thereof will be omitted. Meanwhile, a constant current circuit 32 may be used instead of the pilot resistor 28.

Eighth Embodiment of Current Monitoring Method

Figure 25:
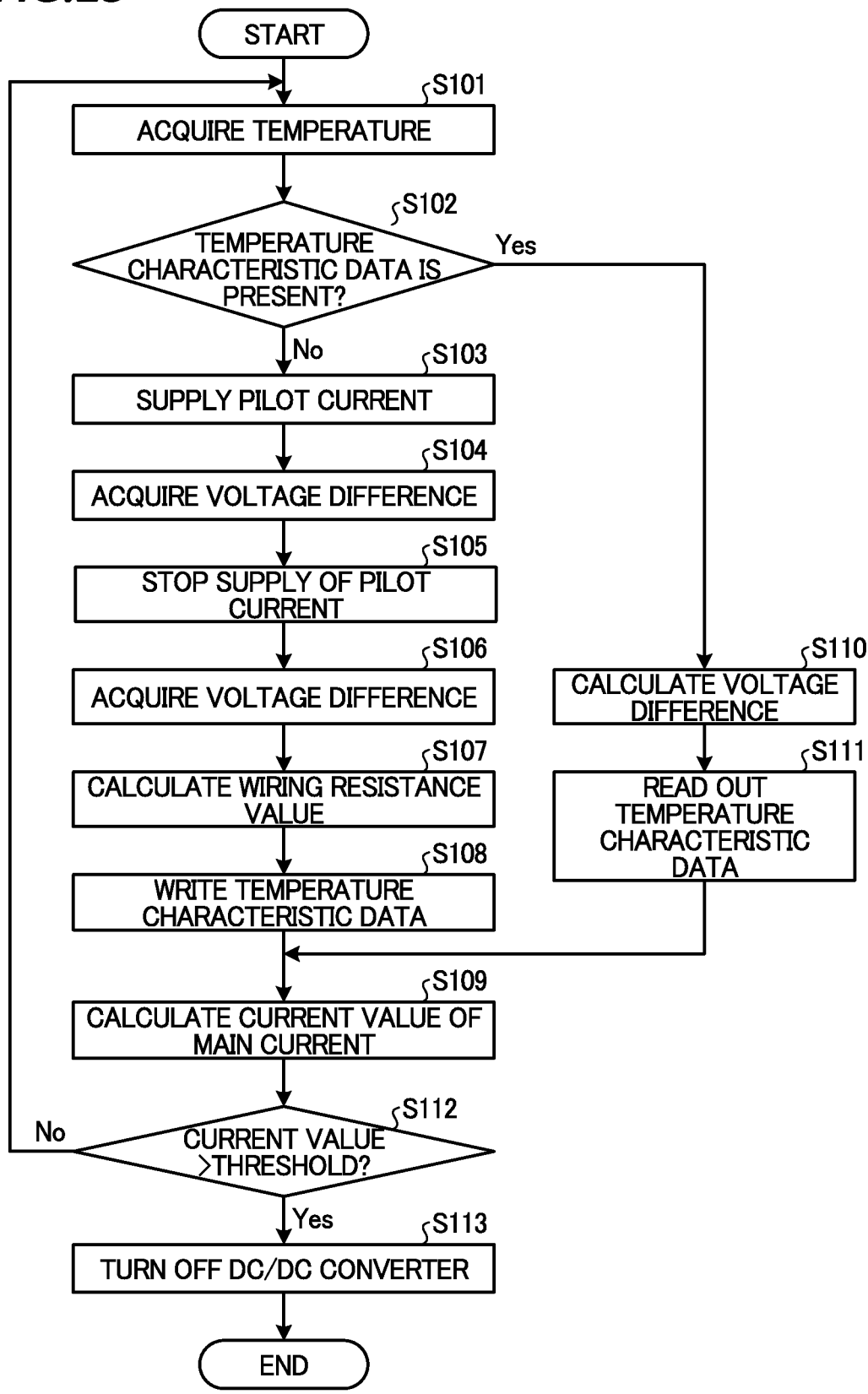
FIG. 25 is a view illustrating an eighth exemplary current monitoring method.

FIG. 25 is a view illustrating an eighth exemplary current monitoring method. The current monitoring method illustrated in FIG. 25 is carried out, for example, in the electronic device illustrated in FIG. 24.

As illustrated in FIG. 25, when the current monitoring method is initiated, for example, in the electronic device illustrated in FIG. 24, the processor calculates the current value of the main current in the same manner as operations S21 to S31 described above (operations S101 to S111).

Subsequently, the processor 31 reads out the threshold of the current value of the main current, for example, from the memory 34 and determines whether or not the current value of the main current calculated at operation S109 exceeds the threshold read out, for example, from the memory 34 (operation S112).

When it is determined that the current value of the main current does not exceed the threshold (operation S112: No), the processor 31 returns to operation S101 and repeats operations S101 to S112. Meanwhile, when it is determined that the current value of the main current exceeds the threshold (operation S112: Yes), the processor 31 outputs a control signal of shutting down the DC/DC converter 23 to the DC/DC converter 23 (operation S113). As a result, the DC/DC converter 23 is switched to the OFF state. In addition, a series of operations in the current monitoring method are terminated.

According to the electronic device illustrated in FIG. 24 and the current monitoring method illustrated in FIG. 25, since the DC/DC converter 23 is switched to the OFF state when the current value of the main current exceeds the threshold, the inflow of an excessive current into the LSI 26 may be suppressed. Accordingly, it is possible to prevent the breakdown of the LSI 26 due to the inflow of the excessive current.

Tenth Embodiment of Electronic Device

A tenth electronic device controls the output voltage of the DC/DC converter 23 based on the output voltage value of the DC/DC converter 23, instead of the shut-down controlling of the DC/DC converter 23 based on the current value of the main current in the ninth exemplary electronic device illustrated in FIG. 24. The tenth exemplary electronic device may be applied to an electronic device which does not employ a feedback control based on the SENCE voltage as illustrated in FIGS. 8 and 9.

The processor 31 calculates the output voltage value of the DC/DC converter 23 based on the wiring resistance value of the wiring portion 25 of the power supply wiring 24, the current value of the main current, and the input voltage value of the LSI 26. For example, the processor 31 may calculate the output voltage value of the DC/DC converter 23 by calculating the following Equation (7) obtained by modifying Equation (1) described above.

$$Vdon = Vlin + Ilsi \times Rptn \qquad (7)$$

As described above, Ilsi is the current value of the main current and is calculated by the processor 31. Rptn is the wiring resistance value of the wiring portion 25 and is calculated by the processor 31. Vlin is the input voltage value of the LSI 26 when the pilot current does not flow and is known. Further, Vdon is the output voltage value of the DC/DC converter 23 when the pilot current does not flow and is known when Rptn and Ilsi are calculated. However, for example, when the feedback control based on the SENCE is not employed, Vdon may vary with the lapse of time.

When the calculated output voltage value of the DC/DC converter 23 does not reach a pre-set threshold, the processor 31 outputs a control signal of increasing the output voltage of the DC/DC converter 23 to the DC/DC converter 23 such that the output voltage value of the DC/DC converter 23 becomes equal to or more than the threshold. Upon receiving the control signal of increasing the output from the processor 31, the DC/DC converter 23 increases the output voltage. The memory 34 may store a threshold which serves as a standard for determining whether to increase the output voltage of the DC/DC converter 23 or not.

Since other configurations are the same as the fourth exemplary electronic device illustrated in FIG. 12, overlapping descriptions thereof will be omitted. Meanwhile, a constant current circuit 32 may be used instead of the pilot resistor 28.

Ninth Embodiment of Current Monitoring Method

FIG. 26 is a view illustrating a ninth exemplary current monitoring method. The current monitoring method illustrated in FIG. 26 may be carried out in, for example, the electronic device illustrated in FIG. 24.

As illustrated in FIG. 26, when the current monitoring method is initiated, for example, in the electronic device illustrated in FIG. 24, the processor 31 calculates the current value of the main current in the same manner as operations S21 to S31 described above (operations S121 to S131). Subsequently, the processor 31 calculates Equation (7) described above to calculate the output voltage value of the DC/DC converter 23. In addition, the processor 31 reads out the threshold of the output voltage value of the DC/DC converter 23 from, for example, the memory 34, and determines whether or not the calculated output voltage value of the DC/DC converter 23 is smaller than the threshold read out, for example, from the memory 34 (operation S132).

When it is determined that the output voltage value of the DC/DC converter 23 is not smaller than the threshold (operation S132: No), the processor 31 returns to operation S121 and repeats operations S121 to S132. Meanwhile, when it is determined that the output voltage value of the DC/DC converter 23 is smaller than the threshold (operation S132: Yes), the processor 31 outputs a control signal of increasing the output voltage of the DC/DC converter 23 to the DC/DC converter 23 such that the output voltage value of the DC/DC converter 23 becomes equal to or more than the threshold value (operation S133). As a result, the output voltage of the DC/DC converter 23 is increased to become the output voltage value which is equal to or more than the threshold. Then, a series of operations in the current monitoring method are terminated.

According to the electronic device illustrated in FIG. 24 and the current monitoring method illustrated in FIG. 26, since the output voltage value of the DC/DC converter 23 is maintained to be equal to or more than the threshold, it is possible to suppress the drop of the output voltage of the DC/DC converter 23 which does not employ a feedback control based on the SENCE voltage. Accordingly, the malfunction of the LSI 26 which is caused by the drop of input voltage may be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
   a power supply circuit configured to supply a main current;
   a receiver circuit configured to be driven by the main current supplied from the power supply circuit;
   a detection circuit configured to detect a voltage difference occurring between both ends of a wiring portion which is at least a portion of a power supply wiring that connects the power supply circuit and the receiver circuit, by a current flowing in the power supply wiring;
   a current supply circuit configured to supply a pilot current having a first current value which is smaller than a second current value of the main current to the power supply wiring; and
   a control circuit configured to control supply of the pilot current and stop of the supply of the pilot current for the current supply circuit, to calculate a wiring resistance value of the wiring portion based on a first value of the voltage difference detected by the detection circuit when the supply of the pilot current is stopped, a second value of the voltage difference detected by the detection circuit when the pilot current is supplied, and the first current value and to calculate the second current value based on the first value of the voltage difference and the wiring resistance value.

2. The electronic device according to claim 1, wherein
   the current supply circuit includes a resistor that is connected, at one end, with the power supply wiring between the wiring portion and the receiver circuit and connected, at the other end, to a ground, wherein a resistance value of the resistor is known and is larger than the wiring resistance value, and
   the control circuit calculates the first current value of the pilot current based on an input voltage value of the receiver circuit and the resistance value of the resistor of the current supply circuit when the pilot current is supplied.

3. The electronic device according to claim 1, wherein the current supply circuit includes a constant current circuit configured to cause the pilot current having a constant current value to flow, the constant current circuit connected to the power supply wiring between the wiring portion and the receiver circuit.

4. The electronic device according to claim 1, further comprising:
   a temperature sensor configured to detect a temperature of the wiring portion; and
   a memory configured to store temperature characteristic data including the wiring resistance value,
   wherein, when data of the wiring resistance value corresponding to the temperature detected by the temperature sensor is stored in the memory, the control circuit reads out the wiring resistance value from the memory so as to calculate the second current value of the main current.

5. The electronic device according to claim 4,
   wherein the temperature characteristic data includes data of a tolerable range of the wiring resistance value for each temperature, and
   wherein the control circuit compares the calculated wiring resistance value with the data of the tolerable range of the wiring resistance value corresponding to the temperature detected by the temperature sensor and, when the calculated wiring resistance value is out of the tolerable range, the control unit calculates again the wiring resistance value of the wiring portion based on the first value of the voltage difference, the second value of the voltage difference, and the first current value of the pilot current.

6. The electronic device according to claim 4,
   wherein the temperature characteristic data includes data of a temperature rise amount of the wiring portion and a variation of the wiring resistance value when the pilot current is supplied, and
   wherein the control circuit calculates a difference between a first temperature detected by the temperature sensor when the supply of the pilot current is stopped and a second temperature detected by the temperature sensor when the pilot current is supplied, reads out a variation amount of the wiring resistance value corresponding to the difference from the memory, and corrects the wiring resistance value when the pilot current is supplied, based on the variation amount of the wiring resistance value.

7. The electronic device according to claim 1, wherein a plurality of receiver circuits are connected to the power supply circuit through a plurality of power supply wirings, respectively, each of the receiver circuit includes the current supply circuit, and the current supply circuit is connected to the power supply wiring between the wiring portion of each wiring power supply wiring and each receiver circuit.

8. The electronic device according to claim 1, wherein, when the second current value of the main current exceeds a threshold, the control circuit controls the power supply circuit to stop the supply of the main current.

9. The electronic device according to claim 8, wherein the control circuit calculates an output voltage value of the power supply circuit based on the wiring resistance value of the wiring portion, the second current value of the main current, and the input voltage value of the receiver circuit, and, when the output voltage value does not reaches the threshold, the control circuit controls the power supply circuit to increase the output voltage value to be equal to or larger than the threshold.

10. A current monitoring method comprising:
    detecting a first voltage difference occurring between both ends of a wiring portion which is at least a portion of a power supply wiring that connects a power supply circuit to supply a main current and a receiver circuit driven by the main current, by causing the main current flowing into the receiver circuit from the power supply circuit so as to flow the main current in the wiring portion;

detecting a second voltage difference occurring between the both ends of the wiring portion by causing the main current and a pilot current having a first current value smaller than a second current value of the main current so as to flow the main current and the pilot current in the wiring portion;

calculating a wiring resistance value of the wiring portion based on a value of the first voltage difference, a value of the second voltage difference, and the first current value of the pilot current; and calculating the second current value of the main current based on the value of the first voltage difference and the wiring resistance value.

11. The current monitoring method according to claim 10, wherein a temperature of the wiring portion is detected and, when data of a wiring resistance value corresponding to the detected temperature is stored in a memory, the wiring resistance value is read out from the memory to calculate the second current value.

* * * * *